United States Patent [19]
Cleeves

[11] Patent Number: 5,830,797
[45] Date of Patent: Nov. 3, 1998

[54] INTERCONNECT METHODS AND APPARATUS

[75] Inventor: James M. Cleeves, Redwood City, Calif.

[73] Assignee: Cypress Semiconductor Corporation, San Jose, Calif.

[21] Appl. No.: 673,749

[22] Filed: Jun. 20, 1996

[51] Int. Cl.$^6$ .................. H01L 21/336; H01L 21/4736
[52] U.S. Cl. ........................................ 438/296; 438/618
[58] Field of Search .................... 437/67, 186, 203; 438/296, 618

[56] References Cited

U.S. PATENT DOCUMENTS

| | | |
|---|---|---|
| 4,711,701 | 12/1987 | McLevige . |
| 4,892,835 | 1/1990 | Rabinzohn et al. . |
| 5,065,208 | 11/1991 | Shah et al. . |
| 5,166,771 | 11/1992 | Godinho et al. . |
| 5,219,784 | 6/1993 | Solheim . |
| 5,258,096 | 11/1993 | Sandhu et al. . |
| 5,362,668 | 11/1994 | Tasaka ............................ 437/67 |
| 5,385,634 | 1/1995 | Bulter et al. . |

FOREIGN PATENT DOCUMENTS

| | | |
|---|---|---|
| 0 242 893 | 10/1987 | European Pat. Off. . |
| 0 303 061 | 2/1989 | European Pat. Off. . |

OTHER PUBLICATIONS

S. Wolf, Silicon Processing for the VLSI Era, Lattice Press (1990) pp. 45–58, 65 1990.
IEDM 95, pp. 907–910, 1995, K.P. Lee, et al., "A Process Technology for 1 GIGA–BIT DRAM".

*Primary Examiner*—John Niebling
*Assistant Examiner*—Michael S. Lebentritt
*Attorney, Agent, or Firm*—Oblon, Spivak, McClelland, Maier & Neustadt, P.C.

[57] ABSTRACT

A damascene method of forming planarized interconnects between conductive material layers in trench-isolated cells in an integrated circuit is disclosed. The method includes depositing and patterning a photoresist layer over a portion of an integrated circuit with isolated devices to expose a portion of an isolation trench separating the conductive layers of isolated devices desired to be interconnected. The method further involves etching a portion of the trench refill material, removing the photoresist layer, and depositing a second conductive layer in the trench to replace the material removed by the etching step. The invention also relates to an interconnected, optionally planarized structure that includes a substrate with an isolation trench defining a first device region and a second device region, a first conductive material in the first and second device regions and adjacent to the trench, a layer of first dielectric material in the trench and adjacent to the first conductive material, and a second conductive material in the trench and overlying the first dielectric material and adjacent to the first conductive material.

5 Claims, 33 Drawing Sheets

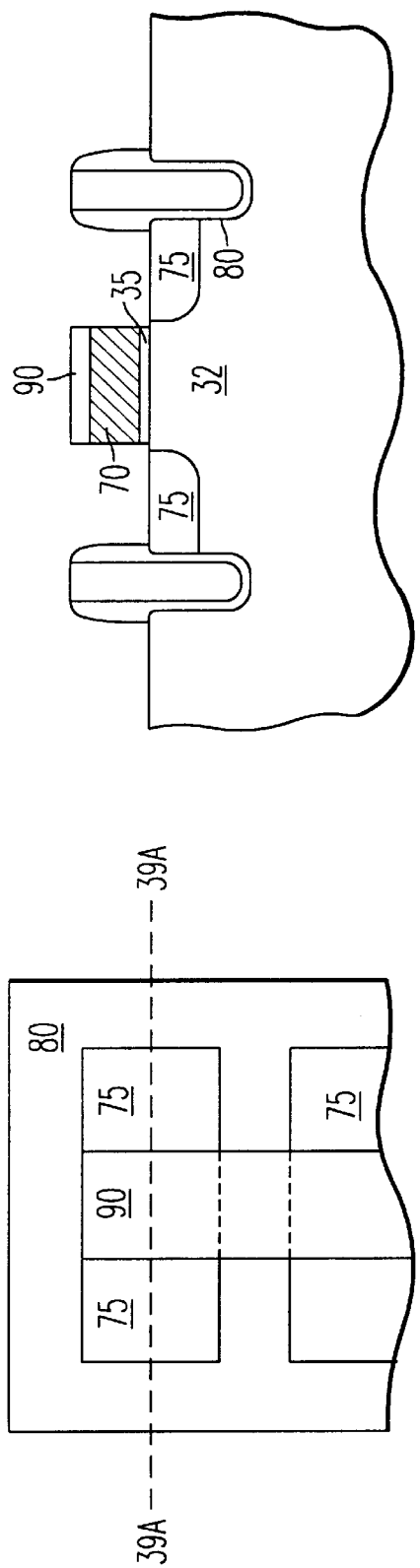
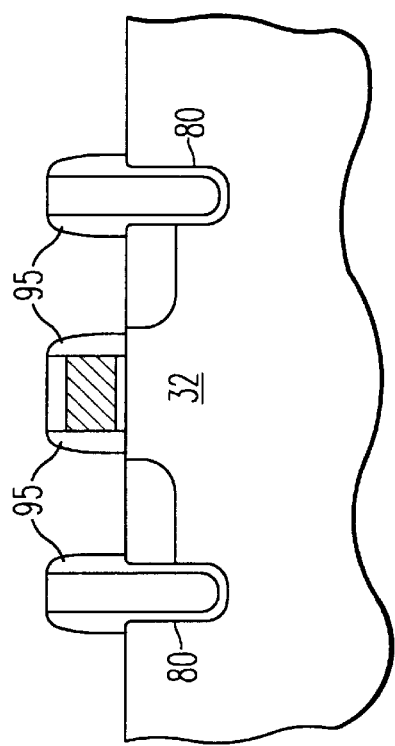
FIG. 38
FIG. 39A
FIG. 39B

INTERCONNECT METHODS AND APPARATUS

BACKGROUND OF THE INVENTION

1. Field of the Invention

The invention relates to methods of fabricating semiconductor devices, including integrated circuits, and more particularly, to a method of forming isolated structures and interconnections in an integrated circuit and to isolated and interconnected structures.

2. Background of the Invention

Integrated circuits generally require electrical isolation between devices fabricated on the same piece of semiconductor. Isolation structures are necessary to prevent the establishment of parasitic channels between adjacent devices. A variety of techniques have been developed to isolate devices in integrated circuits. Two common techniques are Local Oxidation of Silicon ("LOCOS") and trench isolation. LOCOS involves the formation of a semi-recessed oxide in the non-active or field areas of the substrate. Trench isolation involves the formation of an oxide in a trench created in the non-active or field areas of the substrate.

In LOCOS isolation, the oxide is selectively grown over the desired field regions. This is done by covering the active regions with a thin layer of silicon nitride that prevents oxidation from occurring beneath them. After the nitride layer has been etched away in the field regions, the silicon in those regions may be etched for fully-recessed LOCOS or more commonly is simply oxidized without etching to form a semi-recessed LOCOS. Metal interconnects between devices overlie the field oxide regions, wherein the field oxide regions (and optional channel stop implants) prevent the interconnects from forming gates of parasitic MOS transistors. The conductive material that is, for example, the gate portion of the device also overlies a portion of the field oxide region to maintain the field effect of the device. In 0.5 $\mu$m technology, the overlap typically approximates ¼ $\mu$m on each side of the active region. This overlap translates to increased spacing requirements for individual devices in an integrated circuit. Other problems associated with conventional semi-recessed LOCOS include, bird's beak structures of field oxide encroaching into the device-active region, inadequate planarity of the surface topography for submicron lithography needs, and inadequate field oxide thickness in submicron regions.

FIG. 1 shows a planar top view of a prior art LOCOS structure. FIG. 1 is a semi-recessed LOCOS structure with thick field oxide areas surrounding the active area. A metal interconnect overlies the active region of the structure and extends over the field oxide regions. FIG. 2 is a planar side view of the prior art semi-recessed LOCOS structure taken through line A—A of FIG. 1. FIG. 2 shows the thick field oxide regions surrounding the active region.

FIG. 3 demonstrates the consequence wherein the conductive material that makes up the field effect transistor does not completely overlie the active region. In FIG. 3, the field effect of the active device region is diminished because the conductor material does not extend completely through the active region. In this situation, the conductive layer (e.g., polysilicon) cannot control the flow of electricity through the channel.

Trench technology involves the placing of an isolation trench in the non-active or field oxide regions of the integrated circuit to isolate individual devices. Typically a trench isolation method proceeds by masking an active region and exposing a field region and etching a trench in the exposed semiconductor in the field region. Next, a passivation oxide is grown on the side walls of the trench. The passivation growth ties up loose bonds that have been exposed when the trench is made. Once a layer of passivation oxide is formed on the side walls of the trench, the trench is filled with atmospheric-CVD polysilicon, LPCVD polysilicon, CVD $SiO_2$. After refill, the trench is planarized with the substrate by an etch-back process. Next, active devices are formed in the active region, wherein such active regions are surrounded by the isolation trench.

The conventional trench depth falls into three categories: shallow trenches (<1 $\mu$m), moderate depth trenches (1–3 $\mu$m), and deep, narrow trenches (>3 $\mu$m deep, <2 $\mu$m wide). Shallow trenches are used for isolating devices of the same type, but often suffer from problems with preventing latchup and isolating N-channel from P-channel devices in CMOS. Moderate depth trenches are therefore used for bipolar integrated circuits and to prevent latchup in CMOS. Deep, narrow trench structures have been utilized to prevent latchup and to isolate N-channel from P-channel devices in CMOS circuits, and to isolate transistors of bipolar circuits, and to serve as storage-capacitor structures in DRAMs. Thus, there are many differing trench depths for differing applications. For example, if an epitaxial layer is used to change the doping of the semiconductor substrate so that there is a lightly doped region above a heavily doped region, the trench depth need only extend through the lightly doped region and into the heavily doped region to prevent parasitic conductance. Another example is silicon-on-insulator applications where, for capacitance reasons, the trench depth extends all the way through the silicon layer, which is typically approximately 0.25 $\mu$m thick.

The problems associated with the conventional trench isolation technique are that the physical shape of the structure (i.e., abrupt gate to trench transition) can induce high electric field concentrations adjacent to the trench. Further, care must be taken to assure that the subsequent conductive layer extends all the way across the active region so as to avoid the problem of maintaining the field effect of the device. There is no way to know for certain that the conductive layer of the transistor extends completely across the active area without overlapping the conductive layer onto the isolation trench.

The etch-back process to planarize the trench with the semiconductor substrate must also be carefully monitored to avoid removing the isolation material in the trench. Further, in refilling trenches of differing widths, a substantial amount of refill material must be used to ensure that all the trenches are completely filled. The excess refill material is difficult to etch and difficult to control.

FIGS. 4–13(b) demonstrate the prior art trench isolation technique process. First, a masking layer 12 is applied over a semiconductor substrate to expose a trench region. Next, a trench 14 is etched into the semiconductor substrate 10. Next, a passivation oxide 16 is grown on the side walls of the trench 14. The trench is then filled with a refill material 18. Next, the device is planarized to remove excess refill material. The masking layer 12 is then removed, as shown in FIG. 9, and the passivation layer is grown over the refill material. FIG. 10 shows a gate oxide 20 grown in the device region of the substrate 10. FIG. 11 shows the deposition of a polysilicon layer 22 over the gate oxide 20 in the active region. FIG. 12 shows the formation of a gate of polysilicon 22 overlying a gate oxide 20. FIG. 12 also shows the formation of a source/drain diffusion region 24 in the semiconductor substrate.

FIG. 13(a) shows a planar top view of a trench-isolated device region wherein a trench 16 surrounds a conductive layer (e.g., polysilicon layer) 22 and source/drain diffusion regions 24. In FIG. 13(a), the conductive layer 22 overlies the trench 16 to ensure that the conductive material extends completely over the active area. As noted above, this is necessary to ensure the field effect of the transistor. FIG. 13(b) is a planar side view of the structure in FIG. 13 drawn through line A—A. FIG. 13(b) shows adjacent isolated active-device regions wherein the conductive material of each active device overlaps the trench. The overlapping further requires that the trench be wide enough to accommodate for the edge placement accuracy of the conductive layer deposition and the minimum feature size.

Thus far, the discussion has focused on isolating active-device regions within the single-crystal semiconductor substrate of an integrated circuit. Isolating active device regions is extremely important in integrated circuits. These individual devices are linked to form simple structures like inverters or more complex structures like DRAMs and SRAMs. The technology used to connect these isolated devices through specific electrical paths involves thin film paths fabricated above a dielectric (e.g., $SiO_2$) that covers the active-device structures. Wherever a connection is needed between a conductor film and the underlying conductive layer (e.g., polysilicon layer), an opening in the dielectric must be provided to allow such interconnects/contacts to occur. FIG. 14(a) illustrates a planar side view of a CMOS inverter circuit. FIG. 14(b) illustrates the circuit schematic for the device of FIG. 14(a). In the inverter circuit, the drains of the two transistors are connected together by conductor film 26 and form the output, while the input terminal is the common connection 27 to the transistor gates. In a structure such as the inverter shown, the metallization is done simultaneously. In other words, the openings or via for the metallization to the drains and to the gates are made together then a metal (e.g., A1) is deposited in the appropriate opening. Another alternative commonly employed is to create the adjacent gate structures of a single layer of polysilicon that bridges the isolation trench and any other insulating layers to insulate the diffusion regions of the adjacent devices from the common gate.

The same procedure is used to create six transistor static random access memory (6T SRAM) structures. The 6T SRAM structure is comprised of a pair of cross-coupled inverters that store a bit state. Like the simple inverter process, the metallization of the 6T SRAM structure is generally accomplished with the steps of creating vias and depositing a metal (e.g., A1) in a single step or a series of steps to create, for example, the inverter structures and the bit and word lines.

FIG. 15(a) illustrates a top view of a 6T SRAM structure with trench isolation. FIG. 15(b) illustrates a schematic of a 6T SRAM CMOS structure. FIG. 15(a) shows four polysilicon lines 29 formed into gates. An isolation trench 30 runs horizontally through the structure illustrated in FIG. 15(a). Several contact openings 28 are formed in the structure to create the inverters, the bit and word lines, and the $V_{SS}$ power line and the low-resistance $V_{CC}$ line. The contacts 28 are formed with rectangular masks openings with the resulting contact via forming circular openings. The design rules currently used for the CMOS SRAM structure require that the mask that is used to create the contact openings be placed sufficiently far away from other contact openings to hold off voltage leakage. With 0.5 micron technology, a lens typically prints contact openings no closer than 0.5 microns to one another, as a general rule, to compensate for the resolution of the lens and avoid bridging of contacts. FIG. 15(a) illustrates the separation 31 between adjacent mask openings. FIG. 15(c) illustrates adjacent contact openings spaced less than the required distance from one another. FIG. 15(c) illustrates the bridging 100 between the adjacent contacts 28. Thus, the minimum size of the SRAM device is limited by the required distance of separation between adjacent mask openings.

SUMMARY OF THE INVENTION

The invention relates to a damascene method of forming planarized local interconnects between conductive material layers in trench-isolated cells in an integrated circuit wherein each trench-isolated device comprises a conductive material layer adjacent to an isolation trench. Such a method finds use, for example, in connecting P- and N-gates in a CMOS circuit. The method includes depositing and patterning a photoresist layer over a portion of an integrated circuit with isolated devices to expose a portion of an isolation trench separating the conductive layers of isolated devices desired to be interconnected. The method further involves etching a portion of the trench refill material, removing the photoresist layer, depositing a second conductive layer in the trench to replace the material removed by the etching step and optionally planarizing the second conductive layer and the first conductive layer. The invention also relates to an interconnected, optionally planarized semiconductor structure that includes a semiconductor substrate with an isolation trench defining a first device region and a second device region, a first conductive material in the first and second device regions and adjacent to the trench, a layer of first dielectric material in the trench and adjacent to the first conductive material, and a second conductive material in the trench and overlying the first dielectric material and adjacent to the first conductive material. The invention contemplates that the second conductive material and the first conductive material are substantially planarized.

BRIEF DESCRIPTION OF THE DRAWINGS

The features, aspects, and advantages of the invention will become more thoroughly apparent from the following detailed description, appended claims, and accompanying drawings in which:

FIG. 4–13(b) illustrates the prior art trench isolation technique.

FIG. 4 illustrates a planar side view of a semiconductor substrate with a masking layer to expose the trench region.

FIG. 5 illustrates a planar side view of a substrate wherein a trench has been etched.

FIG. 6 illustrates a planar side view of a semiconductor substrate having a trench wherein the walls of the trench have been passivated.

FIG. 7 illustrates a planar side view of the refilling of a trench with refill material.

FIG. 8 illustrates a planar side view of the planarization of the refill material in a trench.

FIG. 9 illustrates a planar side view of a portion of a semiconductor substrate showing the complete isolation of the trench with dielectric material.

FIG. 10 illustrates a planar side view of a portion of a semiconductor substrate showing the formation of a gate oxide in the active device region.

FIG. 11 illustrates a planar side view of a portion of a semiconductor substrate showing the deposition of a conductive material in the active region.

FIG. 12 illustrates a planar side view of an active region of a portion of a semiconductor substrate with a defined gate and source/drain regions.

FIG. 13(b) illustrates a planar side view of adjacent active devices with gate portions, wherein the active device regions are separated by an isolation trench and further wherein the gate portions of the active device regions overlap a portion of the isolation trench.

FIG. 16 illustrates a planar side view of a gate oxide grown over a portion of a semiconductor substrate.

FIG. 17 illustrates a planar side view of a portion of a semiconductor substrate with conductive layer deposited over the gate oxide layer above a semiconductor substrate.

FIG. 18 illustrates a planar side view of a portion of a semiconductor substrate with an isolation mask overlying a deposited layer of a conductive material and a gate oxide wherein the isolation mask exposes a portion of the semiconductor substrate wherein a trench will lie.

FIG. 19 illustrates a planar side view of a portion of a semiconductor substrate after the etching of the conductive layer in the exposed trench region.

FIG. 20 illustrates a planar side view of a portion of a semiconductor substrate after the etching of the gate oxide in the trench region.

FIG. 21 illustrates a planar side view of a portion of a semiconductor substrate after the etching of the semiconductor substrate to form the trench.

FIG. 22 illustrates a planar side view of a portion of a semiconductor substrate after the removal of the isolation mask used to isolate the region that formed the trench.

FIG. 23 illustrates a planar side view of a portion of a semiconductor substrate with a passivation layer grown on the walls of the trench and the side of the conductive layer.

FIG. 24 illustrates a planar side view of a portion of a semiconductor substrate after the reflow of soft glass into the trench.

FIG. 25 illustrates a planar side view of a portion of a semiconductor substrate with a trench adjacent a conductive layer wherein a chemical-mechanical polish has been used to planarize the glass in the trench and the conductive layer.

FIG. 26 illustrates a planar top view of an active region of a portion of a semiconductor substrate with an active region isolated by an isolation trench.

FIG. 27 illustrates a planar side view of the structure of FIG. 26 taken through line B—B. FIG. 27 illustrates a planar side view of a portion of a semiconductor substrate showing two active regions each isolated by trench isolation techniques.

FIG. 28(a) illustrates a planar side view of a portion of a semiconductor substrate with an active region isolated by an isolation trench and a photoresist mask defining a gate region.

FIG. 28(b) illustrates a planar side view of an active region of a portion of a semiconductor substrate with a defined gate isolated by an isolation trench.

FIG. 28(c) illustrates a planar top view of an active of a portion of a semiconductor substrate with a defined gate and diffusion regions isolated by an isolation trench.

FIG. 28(d) illustrates a planar top view of an active region of a portion of a semiconductor substrate with a defined gate isolated by an isolation trench.

FIG. 28(e) illustrates a planar side view of an active region of a portion of a semiconductor substrate with a defined gate taken through line B—B of FIG. 28(d).

FIG. 38 illustrates a planar top view of a portion of a semiconductor structure wherein adjacent isolated devices are connected by a planarized interconnect.

FIG. 39(a) illustrates a planar side view of a portion of an active device taken through line B—B of FIG. 38.

FIG. 39(b) illustrates a planar side view of a portion of a semiconductor substrate taken through line B—B of FIG. 38 wherein dielectric spacers have been added to the conductive layer in the active region and tip implants have been added to the diffusion regions.

FIG. 40(a) illustrates a planar side view of a portion of a semiconductor substrate showing several active devices, each device isolated by trench isolation techniques, wherein a second conductive layer material overlays the substrate.

FIG. 40(b) illustrates a planar side view of a portion of a semiconductor substrate wherein a portion of the second conductive layer has been etched away to isolate adjacent devices.

FIG. 40(c) illustrates a planar side view of a portion of a semiconductor substrate wherein a layer of dielectric material overlies the entire structure.

FIG. 41 illustrates a planar side view of a portion of a semiconductor substrate showing an active region with an insulated gate structure and diffusion regions, wherein the active device region is isolated by trench isolation techniques and wherein a photosensitive post is applied over a diffusion region.

FIG. 42 illustrates a planar side view of a portion of a semiconductor substrate showing an active device region with a photoresist post deposited in a diffusion region and the structure overlaid by a dielectric layer.

FIG. 43 illustrates a planar side view of a semiconductor substrate wherein a planarized dielectric overlies an active device region and wherein a photoresist post is exposed through the planarized dielectric layer.

FIG. 44 illustrates a planar top view of a semiconductor substrate with a pair of active device regions isolated by trench isolation techniques with a diffusion region of each active device region including a photoresist post, the entire structure overlaid by a planarized dielectric such that the photoresist posts are exposed through the dielectric.

FIG. 45 is a planar side view of a portion of a semiconductor substrate illustrating a photoresist mask overlying a planarized layer of dielectric and a photoresist post, wherein the photoresist post extends into the diffusion region of an active device.

FIG. 46 is a planarized top view of a portion of a semiconductor substrate showing several isolated active regions separated by trench isolation techniques, each isolated active region including a photoresist post extending into a diffusion region, the entire structure overlaid by a layer of photoresist to expose a region including a conductive layer strap connecting adjacent active regions.

FIG. 47–54 illustrate the planar side view of the processing steps for forming a contact and first level interconnection layer through line A—A of FIG. 46.

FIGS. 55–62 illustrate the similar formation of a contact and first level interconnection layer taken through line B—B of FIG. 46.

FIG. 47 illustrates a planar side view of the structure of FIG. 46 taken through line A—A wherein the photoresist has been stripped and the planarized dielectric layer has been etched away.

FIG. 48 is a planarized side view of a portion of a semiconductor substrate wherein a thin film, conductive blanket layer is deposited over the substrate.

FIG. 49 illustrates a planar side view of a portion of a semiconductor substrate wherein a tungsten layer is deposited over the thin film blanket layer.

FIG. 50 illustrates a planar side view of a portion of a semiconductor substrate wherein a tungsten blanket layer is planarized with a thin film conductive layer so that the tungsten plug layer exists only in the opening above the conductive layer strap between adjacent active devices.

FIG. 51 illustrates a planar side view of a portion of a semiconductor substrate wherein a dielectric layer overlies the thin film blanket layer.

FIG. 52 illustrates a planar side view of a portion of a semiconductor substrate wherein a layer of photoresist extends over the dielectric layer to pattern a first interconnect layer of the thin-film, blanket layer material.

FIG. 53 illustrates a planar side view of a portion of a semiconductor substrate wherein exposed dielectric material and thin-film, blanket material layer has been etched away.

FIG. 54 illustrates a planar side view of a portion of a semiconductor substrate comprising adjacent isolated active regions electrically connected by a conductive material strap with a thin-film, blanket layer forming an interconnection between the adjacent active regions and another structure.

FIG. 55 is a planar side view taken through line B—B of FIG. 46. FIG. 55 illustrates a removal of the photoresist plug to form an opening to a diffusion region of an active device.

FIG. 56 illustrates a planarized side view of a portion of a semiconductor substrate wherein a thin-film, blanket layer is deposited over the substrate.

FIG. 57 illustrates a planar side view of a portion of a semiconductor substrate wherein a tungsten layer is deposited over the thin-film, blanket layer.

FIG. 58 illustrates a planar side view of a portion of a semiconductor substrate wherein a tungsten blanket layer is planarized with a thin-film, blanket layer so that the tungsten plug layer exists only in the opening above the conductive layer strap between adjacent active devices.

FIG. 59 illustrates a planar side view of a portion of a semiconductor substrate wherein a dielectric layer overlies a thin film blanket layer.

FIG. 60 illustrates a portion of a semiconductor substrate wherein a layer of photoresist extends over the dielectric layer to pattern a first interconnect layer of the thin-film, blanket material.

FIG. 61 illustrates a planar side view of a portion of a semiconductor substrate wherein exposed dielectric material and thin-film blanket layer material has been etched away.

FIG. 62 illustrates a planar side view of a portion of a semiconductor substrate comprising a contact to a diffusion region with a thin-film, blanket layer forming an interconnection between the adjacent active regions and another structure.

FIG. 63 illustrates a planar top view of a portion of a semiconductor substrate with several isolated active device regions wherein an interconnect layer connects diffusion regions of adjacent isolated active devices as well as adjacent conductive regions of another pair of adjacent active devices.

FIG. 64 illustrates a planar top view of a portion of a semiconductor substrate wherein a photoresist mask is applied over a portion of a semiconductor substrate to expose a contact opening region to a conductive material strap connecting gates of adjacent devices.

FIG. 65 illustrates a planar side view of a portion of a semiconductor substrate taken through line C—C of FIG. 64.

FIG. 66 illustrates a planar side view of a portion of a semiconductor substrate showing an oxide etch through the exposed portion of the semiconductor substrate.

FIG. 67 illustrates a planar side view of a portion of a semiconductor substrate showing an etch of underlying interconnect material in the exposed region.

FIG. 68 illustrates a planar side view of a portion of a semiconductor substrate, wherein an exposed portion of dielectric material is etched to expose a conductive material strap between adjacent gates of distinct isolated active regions.

FIG. 69 illustrates a planar side view of a portion of a semiconductor substrate showing a contact opening to a conductive material strap between adjacent gates of distinct isolated active regions.

FIG. 70 illustrates a planar side view of a portion of a semiconductor substrate wherein a spacer oxide is deposited over the substrate and in the contact opening to the conductive material strap between adjacent gates of distinct active regions.

FIG. 71 illustrates a planar top view of a portion of a semiconductor substrate with defined regions above a conductive material strap connecting adjacent devices and and regions above diffusion regions of other adjacent devices.

FIG. 72 illustrates a planar side view of a portion of a semiconductor substrate wherein the dielectric spacer material is etched to form lateral spacer side walls in the contact opening and around the first interconnect material layer.

FIG. 73 illustrates a planar side view of a portion of a semiconductor substrate, wherein a thin layer of conductive material has been deposited over the substrate and in the contact opening to the conductive material strap between adjacent gates of distinct isolated active regions.

FIG. 74 illustrates a planar side view of a portion of a semiconductor substrate wherein a photoresist masking layer is applied over a portion of the substrate to protect an interconnect material layer.

FIG. 75 illustrates a planar side view of a portion of a semiconductor substrate wherein the exposed thin conductive layer is etched.

FIG. 76 illustrates a planar side view of a portion of a semiconductor substrate with a second layer interconnect structure.

FIG. 77 illustrates a planar top view of a portion of a semiconductor substrate wherein a second level interconnect, between diffusion regions of adjacent active devices and the conductive material strap between other adjacent active devices, overlies a first conductive material layer.

FIG. 78 illustrates a planar side view of a portion of a semiconductor substrate wherein a dielectric layer is deposited over the substrate.

FIG. 79 illustrates a planar side view of a portion of a semiconductor substrate wherein a dielectric layer overlying the substrate is planarized.

FIG. 80 illustrates a planar side view of a portion of a semiconductor substrate wherein a contact opening is made to a second level interconnect layer.

DETAILED DESCRIPTION OF THE INVENTION

A method of forming isolated structures and interconnects between those structures, and the structures themselves are described. Also described is a trench-isolated cell structure and a structure comprising adjacent, trench-isolated cells electrically coupled through a planarized local interconnect. Further described is a scalable integrated circuit structure with overlapping interconnects and a method of making the same. In the following detailed description, numerous details such as specific materials, structures, dimension, chemicals, process parameters, and techniques are set forth in order to provide a more thorough understanding of the invention. It will be appreciated, however, by one of ordinary skill in the art, that these specific details need not be employed to practice the invention. In other instances, well known materials or methods have not been described in detail in order to avoid unnecessarily obscuring the invention.

Isolation Technique

Figure 16:
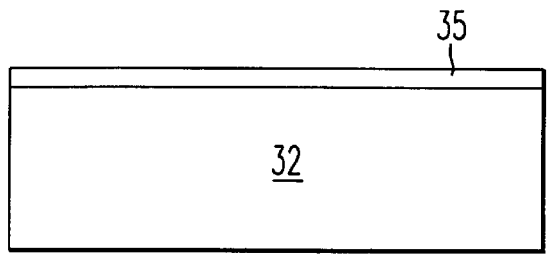
FIGS. 16–27 illustrate a method of formation of an isolation trench according to the invention.
Figure 17:
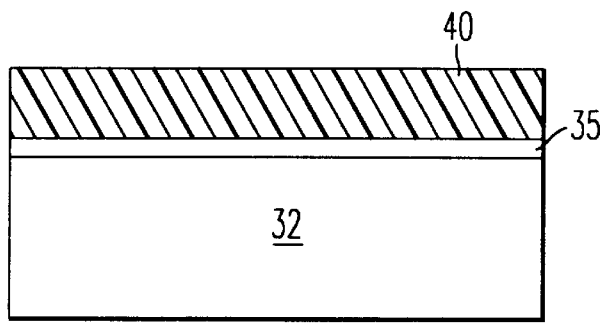

FIG. 16 illustrates a planar side view of a portion of a semiconductor substrate 32 that can be either p- or n-type. It is to be appreciated by a person of ordinary skill in the art that the invention is not limited to a specific substrate, but can be other semiconductor substrates, e.g., GaAs, or hybrid substrates, e.g., SOI, SiGe. The semiconductor substrate 32 contains a gate oxide 35 grown over the substrate 32. FIG. 17 illustrates another planar side view wherein a conductive layer has been deposited over the gate oxide 35 on the semiconductor substrate 32. The conductive layer 40 can be, for example, polysilicon. The polysilicon layer 40 is deposited by low pressure chemical vapor deposition ("LPCVD") using an LPCVD tube and $SiH_4$ gas at 200–400 mtorr with a thickness of 2,000–3,000 Å. It should be appreciated by those skilled in the art that this conductive layer 40 could instead be a metallic conductor of, for example, W, Mo, Ta, and/or Ti, or that this conductive layer 40 could also be a silicide, consisting of $WSi_2$, $MoSi_2$, $TaSi_2$, PtSi, PdSi, or that this conductive layer 40 can further be a layered structure consisting of a silicide on top of doped polysilicon.

Figure 18:
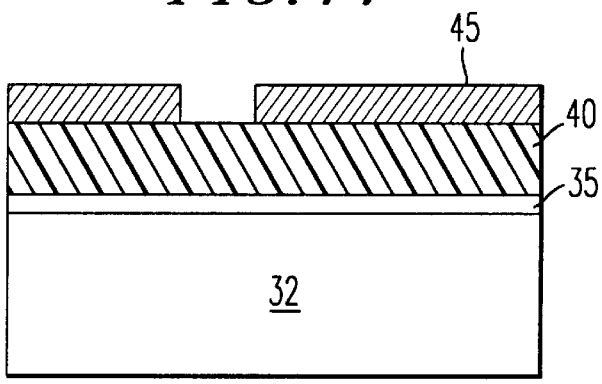

FIG. 18 illustrates a planar side view of a portion of the semiconductor substrate 32 wherein an isolation mask 45 overlies the conductive material, e.g., polysilicon, exposing a region in the conductive layer 40 where the trench is to be formed. In the preferred embodiment, the isolation mask is photoresist material. Alternatively, the isolation mask may be a thick undoped oxide, e.g., 1 kÅ, covered by a layer of photoresist. The thick oxide may also function as an etch- or polish-stop for subsequently planarizing the refill material in the trench (see FIG. 23 and accompanying text). The thick oxide also protects against the loss of conductive layer material if the selectivity between the photoresist and the trench etch is inadequate.

Figure 19:
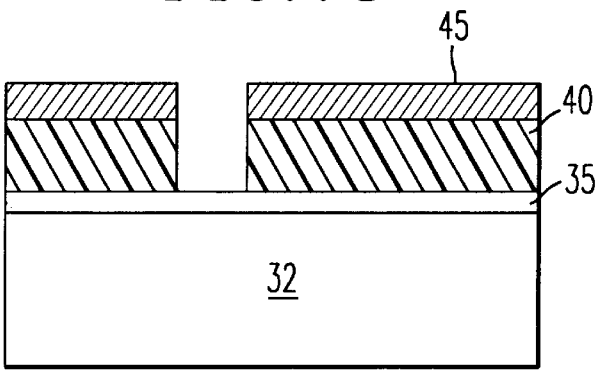
Figure 20:
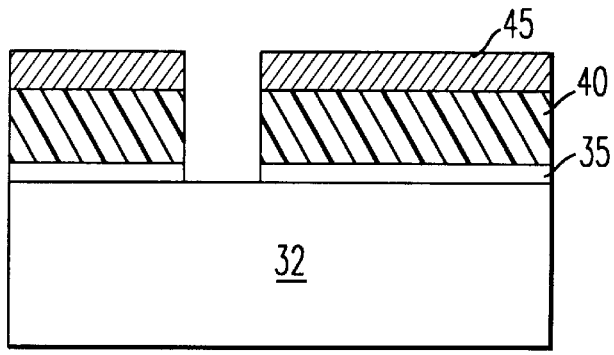

FIG. 19 illustrates a planar side view of the portion of the semiconductor substrate 32 with a conductive layer 40 and gate oxide 35, wherein the exposed portion of the conductive layer 40 has been etched using a parallel-plate plasma etcher with a power of 200–300 watts. Next, as illustrated in FIG. 20, the exposed gate oxide is etched with a conventional oxide etch (e.g., $CHF_3/O_2$) to expose the semiconductor substrate 32. It should be recognized by one of ordinary skill in the art that etch selectivity is not important at this step, since the subsequent step is to etch the substrate. Thus, a non-selective etch that etches the gate oxide and a portion of the substrate may be used.

Figure 21:
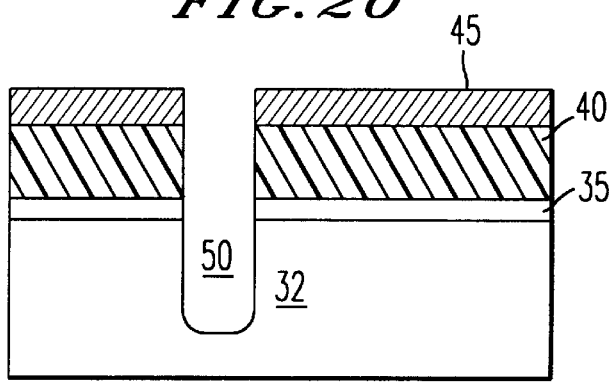
Figure 22:
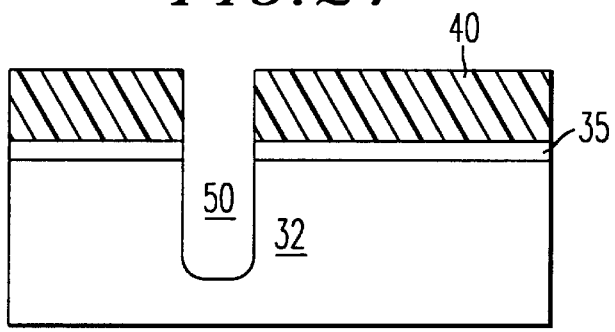

Next, as illustrated in FIG. 21, a trench 50 is etched to the desired depth. The trench should be etched in such a way that the side walls are smooth and slightly tapered, particularly if the trench is to be refilled by CVD. CVD refill techniques necessitate smooth, tapered side walls so that the trench can be refilled without the formation of voids. The bottom of the trench is preferably smooth with rounded corners, ideally U-shaped, in order to maintain the integrity of the oxide that is grown on the trench surface after the etch (see FIG. 23 and accompanying text), and for keeping stress-induced defects from being generated during the oxide growth.

The etching of the trench is preferably carried out with a conventional chlorine etch chemistry, e.g., $BCl_3/Cl_2$, $H_2/Cl_2/SiC_4$, and $CHCl_3/O_2/N_2$. The trench depth is also preferably uniform across the semiconductor substrate and determined by the particular requirements of the structure.

Figure 23:
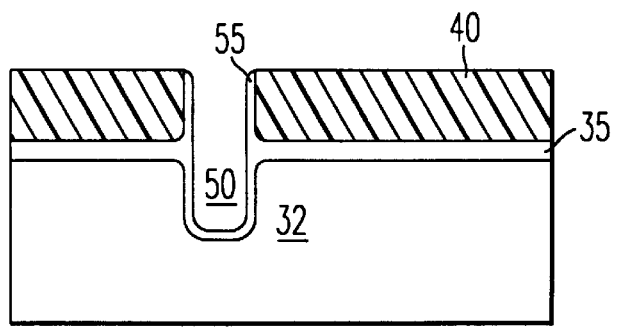

Once the trench 50 is formed in a semiconductor substrate 32, FIG. 23 illustrates that a passivation layer of thermal oxide up to approximately 400 Å thick is grown on the walls of the trench 50 as well as the side walls of the conducting layer 40. The growth conditions are similar to the conventional conditions for growing a gate oxide (e.g., steam and dry $O_2$) optimized to leave rounded corners. The passivation layer is recommended to oxidize loose bonds that have accumulated after the substrate etch. The passivation layer 55 is grown at a gate-oxide-cycle or higher temperature to ensure a rounding of the corners of the trench and on the conductive layer 40 to facilitate reduced electric fields at these edges.

Figure 24:
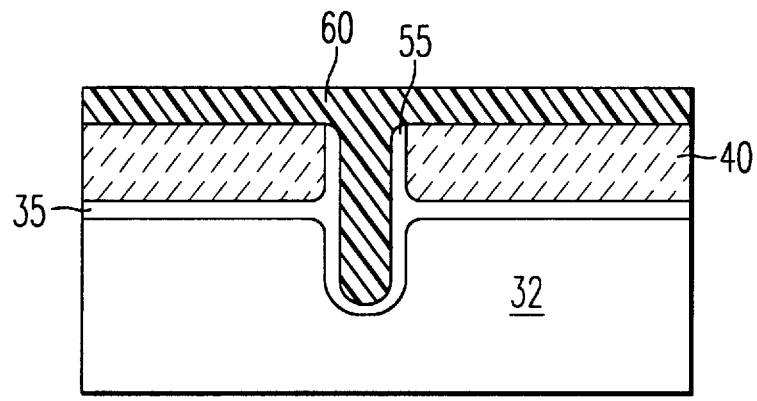
Figure 25:
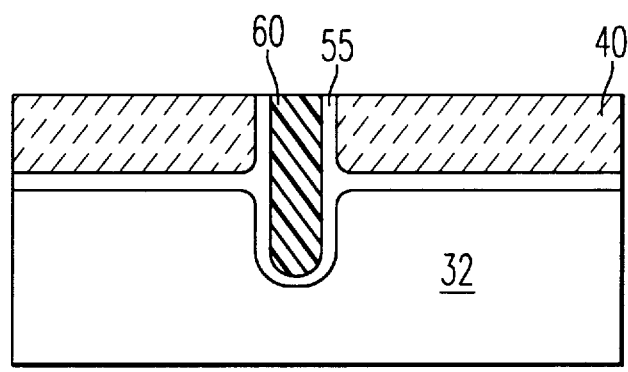

Next, a trench refill layer is applied to fill the trench (FIG. 24). The trench refill layer is preferably a glass that is a doped oxide with a low modulus of elasticity at elevated temperatures. The trench refill layer may also be a CVD silicon dioxide ($SiO_2$), spin-on-glass (SOG), silicon nitride ($Si_3N_4$), borophosphosilicate glass (BPSG), a low temperature oxide (LTO), an oxynitride, or any other suitable dielectric material applied using suitable methods. A soft glass is preferred because a soft glass is easy to apply and, once applied, will not cause increased mechanical stress at the base of the trench at increased device temperatures. The soft glass also melts at high temperature (800°–900° C.) to flow which ensures that trenches of differing widths get completely filled because of the flowing process of the glass into the trenches. Thus, the preferred application process eliminates the need to apply an overabundance of refill material to confidently fill trenches of differing widths. Further, a soft glass is preferred, because subsequent planarization, wherein the trench is planarized with the conductive layer 40 (illustrated in FIG. 25), may be accomplished quickly by a chemical-mechanical polish rather than an etch-back technique. The chemical-mechanical polish technique uses a slurry with a chemistry including a colloidal silica to evenly remove the excess glass material. FIG. 25 illustrates a structure wherein the refill material 60 in the trench and the passivation layer 55 are planarized with the conductive layer 40.

The filling of the trench with a passivation oxide and a refill material has been described as a two step process. However, it should be appreciated that the passivation and refill of the trench may be accomplished simultaneously. For example, the glass refill material may be flowed under steam conditions. The steam conditions will passivate the walls of the trench and the conductive layer as the glass is densified.

Figure 26:
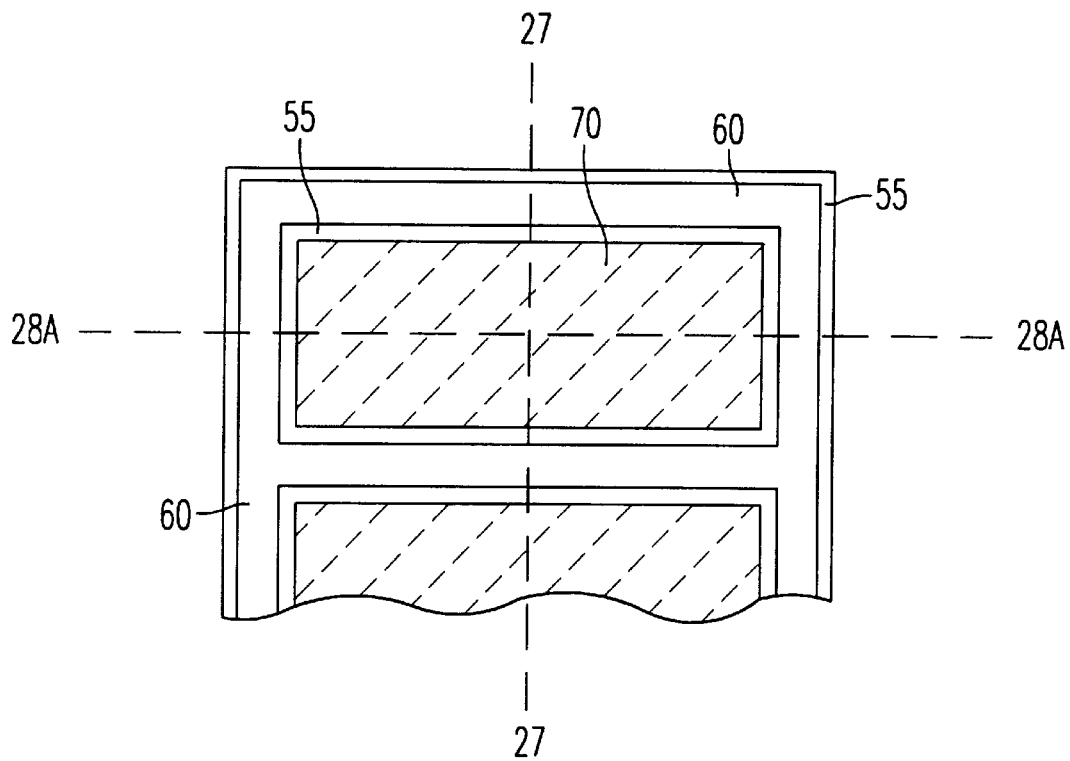
Figure 27:
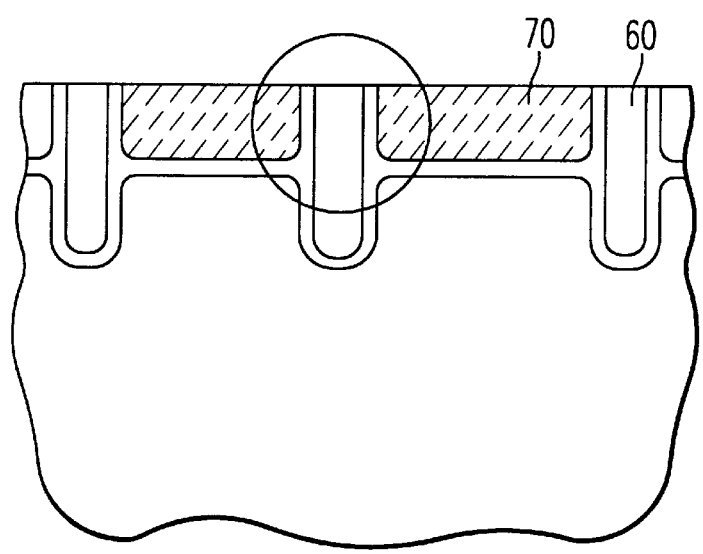

FIG. 26 illustrates a planar top view of a portion of a semiconductor substrate with an isolated active region, isolated by an isolation trench. The isolation trench is formed of refill material 60 surrounded by a passivation layer 55. In the center of the active region lies a gate 70 surrounded by diffusion regions 75. FIG. 27 presents a planar side view through line B—B of FIG. 26.

Figure 28A:
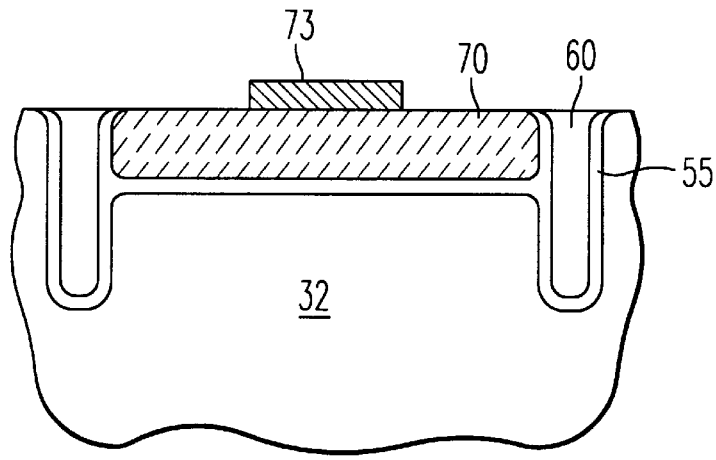
FIGS. 28(a)–(e) illustrate a method of formation of a gate in an active device region.
Figure 28B:
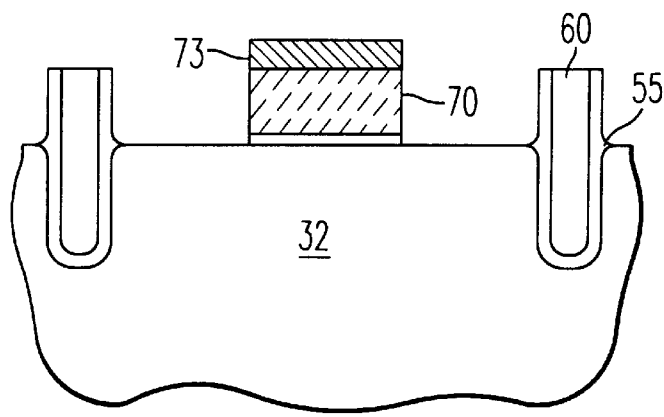
Figure 28C:
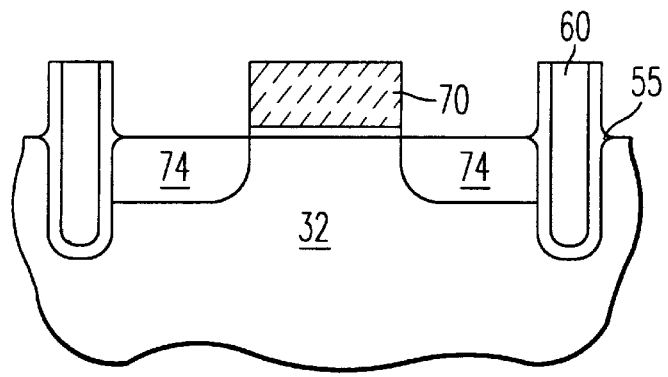
Figure 28D:
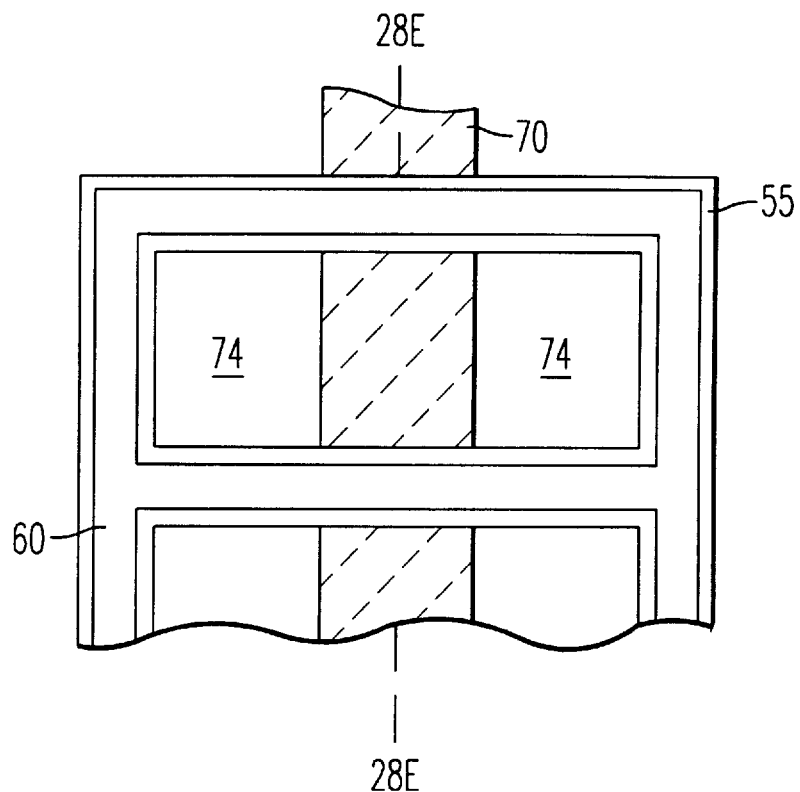
Figure 28E:
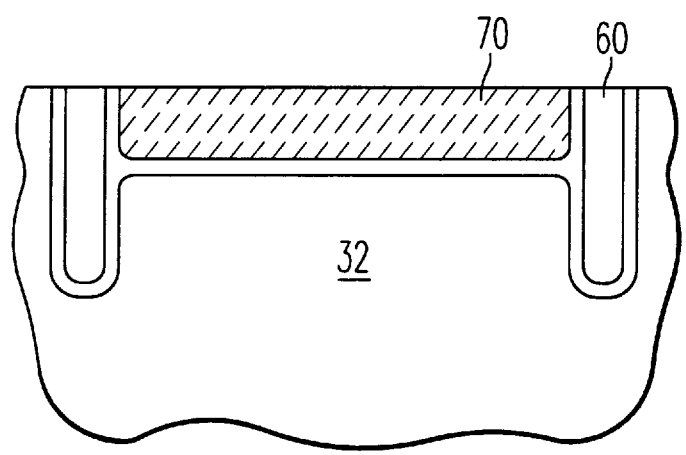

At this point, a gate may be formed in the trench isolated active device region. Defining of the active region at this point would be done where simple structures, e.g., distinct isolated gates, are contemplated. FIGS. 28(a)–(e) represent the processing steps to form a gate in the active device region. FIG. 28(a) is a planar side view through line A—A of FIG. 26 wherein a photoresist mask 73 overlies a portion of the conductive material 70 that is to form a gate. In FIG. 28(b), the conductive layer 70 and the underlying dielectric have been removed to expose the substrate in regions adjacent to the conductive layer gate 70. FIG. 28(c) shows the device wherein the photoresist mask has been removed and diffusion region 74 added. FIG. 28(d) shows a planar top view of the structure illustrated in FIG. 28(c). FIG. 28(e) shows the same structure taken through line B—B of FIG. 28(d).

FIGS. 26–28 illustrate the self-aligning nature of the conductive layer to the trench in the trench isolated device contemplated by the invention. The invention contemplates that there is no overlap of conductive material into the isolation region that is the trench. Thus, the invention contemplates that the integrity of each active device region is maintained (i.e., the field effect of a field effect transistor). The inventive apparatus and the apparatus produced by the inventive method do not require that the conductive material layer overlap the isolation region. Thus, the invention contemplates that tighter design spacing tolerances may be achieved between adjacent devices.

The invention also contemplates that the walls of the trench and the sidewalls of the conductive layer adjacent to the trench are both passivated. This dual passivation yields enhanced oxidation at the junction between the conductive layer and the isolation trench producing a wider interface between the conductive layer and the semiconductor substrate. The wider interface reduces the field strength at the junction which enhances the performance of the active devices of the invention.

Planar Local Interconnects

Figure 29B:
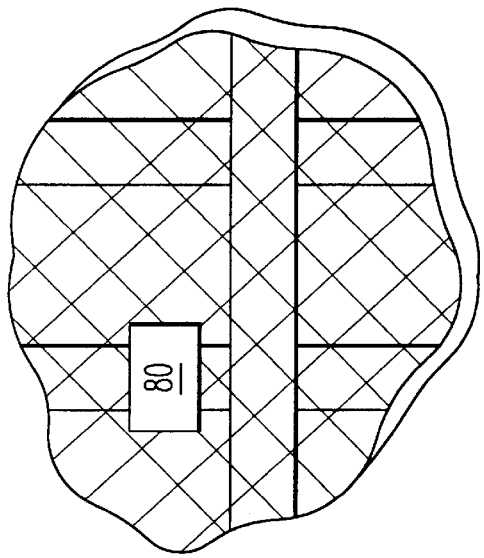
FIG. 29(b) is a planar top view of a portion of a semiconductor substrate illustrating a photoresist mask covering the device and exposing an isolation trench between adjacent active devices.
Figure 29A:
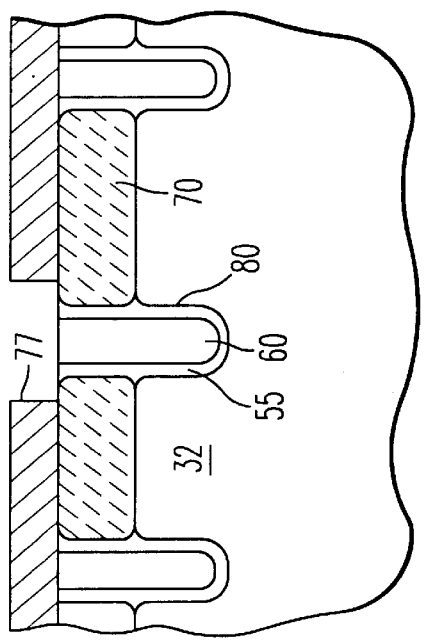
FIG. 29(a) illustrates a portion of a semiconductor substrate wherein a photoresist mask is applied over active regions of isolated devices to expose an isolation trench between adjacent active devices.
Figure 30:
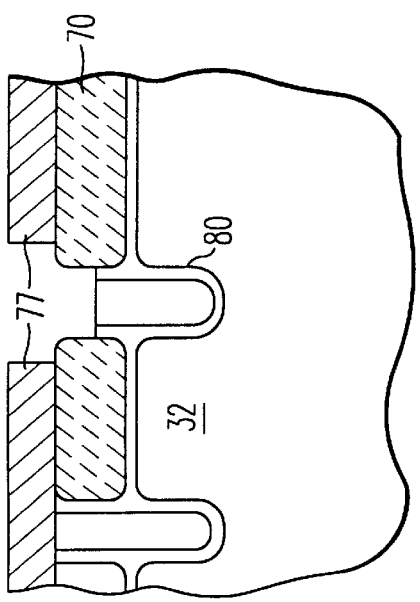
FIG. 30 is a planar side view of a portion of a semiconductor substrate showing an isolation trench after a portion of the refill material in the isolation trench has been etched away.

Many semiconductor structures require that active device regions be interconnected. The invention also relates to a method of interconnecting device regions and an apparatus with interconnect device regions. Referring to the structure shown in FIG. 27, FIG. 27 illustrates a planar side view of a portion of a semiconductor substrate comprising two trench-isolated devices with each device containing a first conductive layer 70 throughout the active region. FIG. 27 is a cross-sectional view of FIG. 26 taken through line B—B. FIG. 29(a) illustrates the same portion wherein a photoresist mask 77 overlies the portion of the semiconductor substrate exposing the trench 80. FIG. 29(b) is a planar top view of the structure illustrated in FIG. 29(a). As noted in FIGS. 29(a)

and 29(b), the opening in the photoresist mask 77 to expose the isolation trench 80 need not be accurately aligned to the edge of the trench 80 because a selective subsequent etch of trench material will not etch the adjacent conductive material 70.

The exposed portion of the trench is carefully etched to remove a portion of the refill material approximately one-half the thickness of the conductive layer. Care must be taken so that the etch does not proceed as far as the single crystal silicon (i.e., the semiconductor substrate) or the adjacent conductive layers (e.g., adjacent gates) will end up shorted to the substrate. For a refill material that is a doped oxide or soft glass, a standard oxide etch is used (e.g., $C_2F_6$/He at 900 mtorr).

Figure 31:
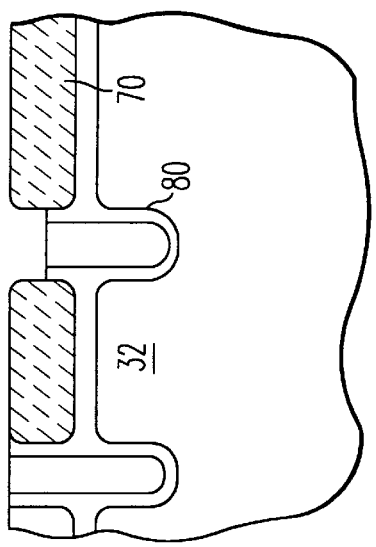
FIG. 31 illustrates a planar side view of a portion of a semiconductor substrate, wherein a portion of an isolation trench has been etched away.
Figure 32:
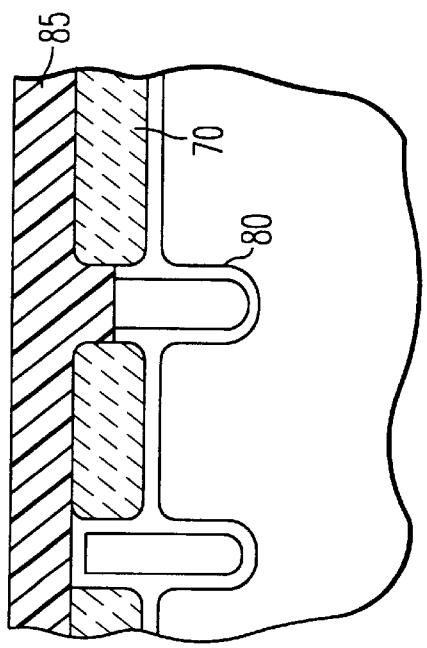
FIG. 32 illustrates a planar side view of a portion of a semiconductor substrate wherein a second conductive layer has been deposited over the adjacent isolated devices and into the exposed portion of the trench between the adjacent devices.
Figure 33:
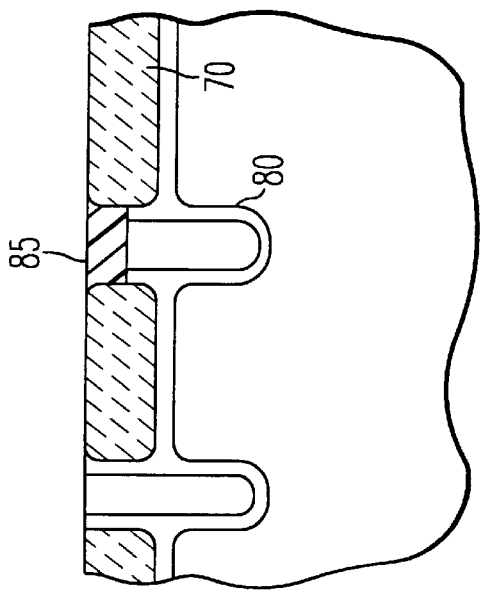
FIG. 33 illustrates a planar side view of a portion of a semiconductor substrate wherein the second conductive layer has been planarized with the first conductive layer.

Once the trench material is partially removed, the photoresist mask 77 is stripped as shown in FIG. 31. Next, a second layer of conductive material 85 is deposited over the substrate so that the second conductive layer 85 fills the void in the opened trench. FIG. 32 illustrates a planar side view of a second layer of conductive material deposited over a portion of a semiconductor substrate. The conductive layer 85 can be polysilicon wherein it is deposited by LPCVD using an LPCVD tube and $SiH_4$ gas at 200–400 mtorr to a thickness sufficient to overfill the void in the trench created by the preceding etch. It should be appreciated by those skilled in the art that this conductive layer 85 could instead be a metallic conductor of, for example, W, Mo, Ta, and/or Ti. Next, as shown in FIG. 33, the second conductive layer 85 is planarized with the first conductive layer 70. Planarization can be achieved by an etch-back process or by polishing the second conductive layer 85 with a chemical-mechanical polish. If an etch-back process is used, care must be taken to avoid over-etching the first and second layers of conductive material. A chemical-mechanical polish is preferred because the terminating point of the removal of the second conductive layer 85 can be regulated more carefully, because there is a discernible stopping point for the polish to stop (i.e., when it reaches the top of the trench 80). The resulting structure is adjacent trench-isolated cells linked through a strap 85 of second conductive layer material.

Figure 34:
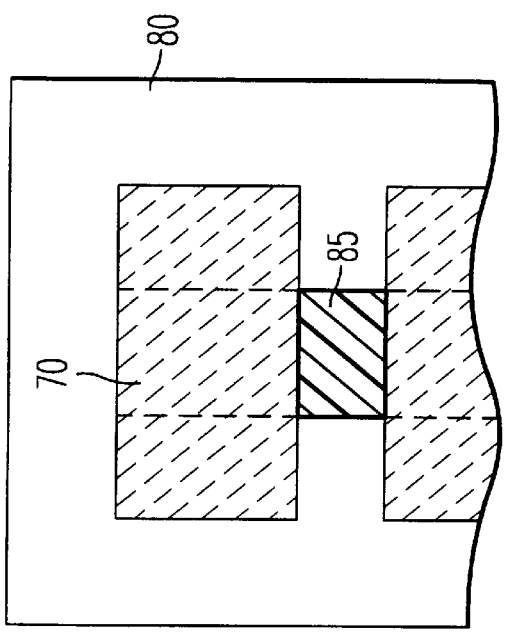
FIG. 34 illustrates a planar top view of a portion of a semiconductor substrate wherein a second level conductive layer has been planarized with the isolation trench and the first level conductive layer.

In the example wherein the first conductive layer and the second conductive layer are polysilicon, the first conductive layer and second conductive layer are next, optionally, put through a silicide process to form metal silicides. Typical metal silicides include $TiSi_2$, $TaSi_2$, $MoSi_2$, $WSi_2$, and $PtSi$. FIG. 34 illustrates a planar top view of a portion of a semiconductor substrate wherein a strap 85 of second conductive layer material connects two adjacent trench-isolated cells.

Figure 35:
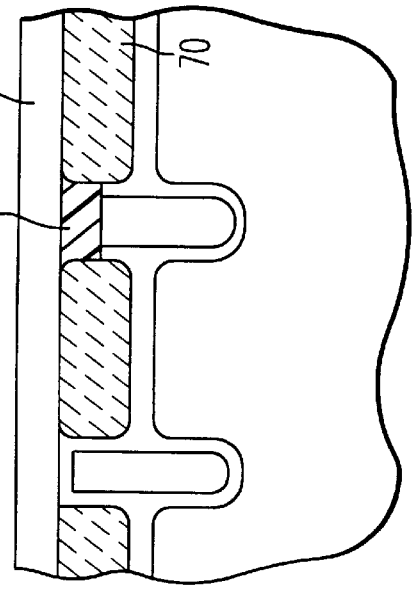
FIG. 35 illustrates a planar side view of a portion of a semiconductor substrate wherein a dielectric has been placed over a device.

Next, a cap dielectric 90 is applied over the semiconductor substrate as shown in FIG. 35 to cap a region wherein gate structures will lie. The cap dielectric 90 may comprise any dielectric, including a single oxide, or several layers formed by various methods. For example, one or more layers of oxide may be deposited by plasma-enhanced chemical vapor deposition ("PECVD"), thermal CVD, atmospheric pressure CVD, sub-atmospheric pressure CVD, for example utilizing TEOS and oxygen or TEOS and ozone chemistries. Additionally, one or more layers of dielectric cap 90 may be a SOG layer.

Figure 36A:
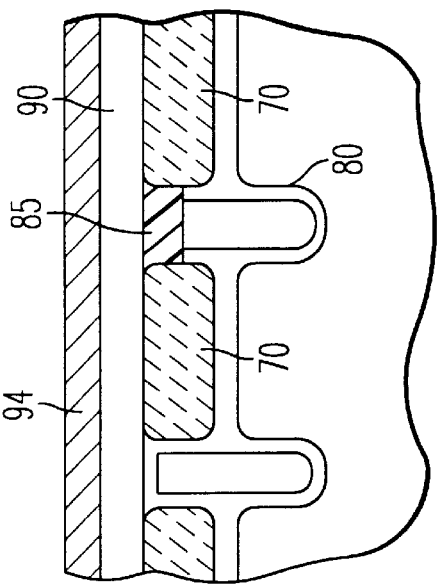
FIG. 36(a) illustrates a planar side view of a portion of a semiconductor substrate wherein a photoresist mask is applied to protect the first conductive layer in a region that will become a gate and protect the second level conductive layer in the region that is to become a conductive strap between adjacent isolated gates.

FIG. 36(a) illustrates a planar side view of a portion of a semiconductor substrate wherein a photoresist mask overlies the cap oxide 90 and protects the first conductive layer in the adjacent isolated devices. The photoresist mask 94 exposes the diffusion regions in the adjacent isolated devices so that the first conductive layer material in those regions may be subsequently removed. The photoresist mask 94 also protects a portion of the second conductive layer material strap 85 interconnecting the first conductive layer 70 in the two adjacent devices. It should be noted that the photoresist mask 94 need not cover the entire area of the strap 85 and that some of the strap 85 may eventually get etched away in a subsequent conductive material etch (see FIGS. 37–38 and accompanying text). Such a situation would occur, for example, where the strap etch was not optimally aligned with the regions that were later to form the adjacent, interconnected gates. In this instance, a subsequent photoresist over the gates would not cover the entire surface area of the strap. The invention contemplates that the alignment of the strap to the adjacent gates is not critical since the work function of the individual devices is primarily performed by the gates, and not the strap between the gates and since it applies a low current electrical contact only.

Figure 36B:
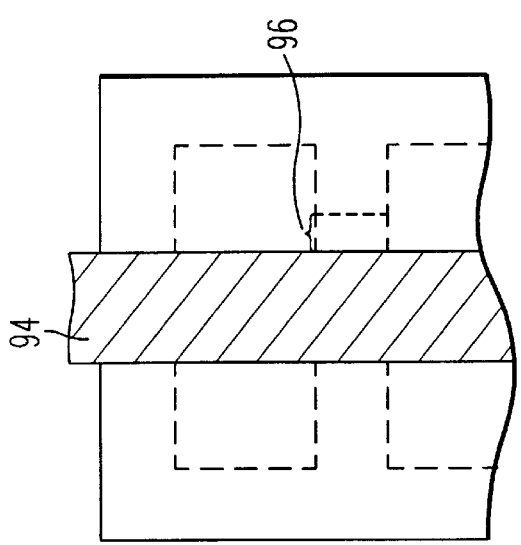
FIG. 36(b) illustrates a planar top view of a portion of a semiconductor substrate showing a continuous photoresist mask strip overlying a portion of the substrate to protect underlying conductive material that is to form gate structures.

FIG. 36(b) illustrates a planar top view of a portion of a semiconductor substrate wherein a photoresist mask 94 overlies conductive material that is to form a gate and exposes conductive material that is to be removed to form diffusion regions. FIG. 36(b) illustrates that the photoresist mask 94 is continuous and does not stop at the edge of isolation. The patterning of a single, continuous photoresist strip 94 provides enhanced fidelity with easier control. FIG. 36(b) also illustrates the situation where the photoresist mask 94 does not cover the entire area of the conductive strap between adjacent gates. FIG. 36(b) shows an area 96 in which a portion of the strap lies unprotected by the photoresist mask 94. The unprotected portion 96 of strap material will be etched away by a subsequent conductive material etch. The loss of this material will not inhibit the performance of the adjacent devices that the strap connects.

Figure 37:
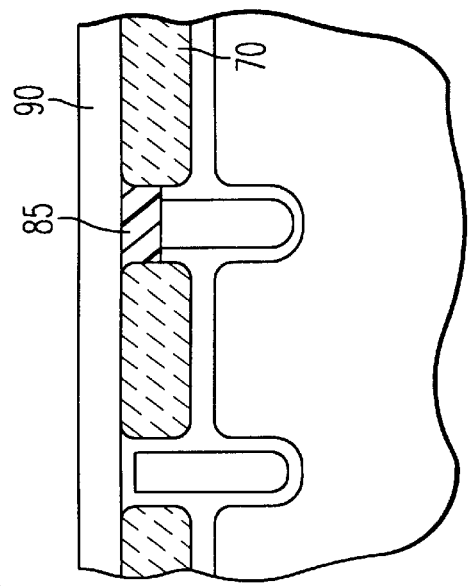
FIG. 37 illustrates a planar side view of a portion of a semiconductor substrate having planarized interconnect material between two adjacent devices wherein the conductive material is covered by a dielectric layer.

Once the photoresist mask 94 is applied, the unprotected cap dielectric is removed from the substrate using a conventional etch (e.g., $C_2F_6$/He at 900 mtorr for an oxide). Following the dielectric etch, the first conductive layer material in the diffusion regions is etched. In the example where the first conductive layer is a polysilicon, a chlorine plasma ($Cl_2$/He) etch is used to remove the excess polysilicon from the diffusion regions in the active devices. Next, the photolithographic mask is removed as shown in FIG. 37, and the semiconductor substrate 32 is left with a dielectric cap 90 overlying the first conductive layers 70 in adjacent devices and the second conductive layer strap 85 interconnecting the first conductive layers 70 in the adjacent isolated devices.

FIG. 38 is a planar top view of a portion of the semiconductor substrate illustrating the cap dielectric 90 extending between the two adjacent trench-isolated devices. The second conductive layer covered by the cap oxide is illustrated in ghost lines. In FIG. 38, the cap dielectric material and the first conductive layer material have been removed from the diffusion regions 75. FIG. 39(a) illustrates a planar side view of a portion of the semiconductor substrate taken through line B—B of FIG. 38. FIG. 39(a) illustrates an active device between trenches 80, the active device consisting of a semiconductor substrate 32 with diffusion regions 75. Overlying the semiconductor substrate 32 and self-aligned to the diffusion regions are a gate oxide 35, a first conductive layer that forms a gate 70 with a cap dielectric layer 90. Next, source/drain implants may optionally be added to the diffusion region by conventional ion implantation techniques to modify the doping in the diffusion regions.

Dielectric spacer portions 95 are then formed between the first conductive layer 70 and the diffusion regions by depositing a dielectric material over the gate structure and etching spacer portions 95 extending into the diffusion region (i.e., a contact opening) and adjacent to the first conductive layer 70 approximately 1500 Å in width. The spacer portions depostion is not selective to the gate, so spacer dielectric material also is deposited on the isolation trench. The spacer portions 95 may be any dielectric, for example, $SiO_2$, TEOS, $Si_xN_y$, and $SiO_xNy$. Additional source/drain implants may then be optionally added to the diffusion regions by conventional ion implantation techniques to modify the doping in the diffusion regions.

The planar local interconnect structure and method of making the structure described is particularly suitable for connecting adjacent gates of a CMOS SRAM structure. In a 6T CMOS SRAM, P- and N-type transistors are coupled to form inverters. The planar interconnect described above can be used to connect the P- and N-type gates of adjacent devices to form the input terminal of the inverter.

Figure 40A:
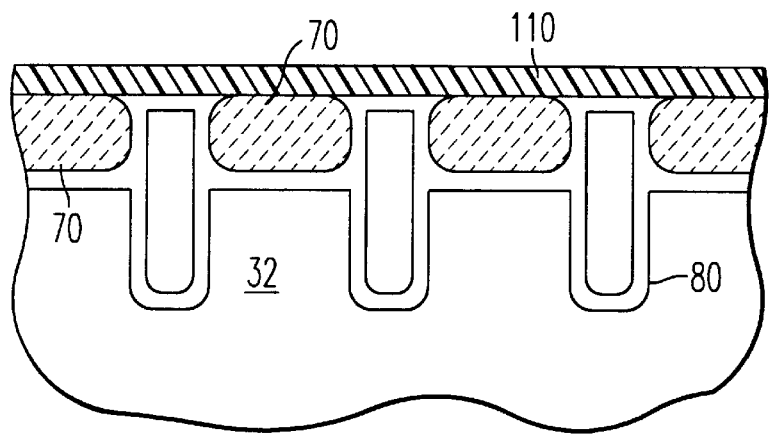
FIGS. 40(a)–(c) illustrate an alternative method of forming a planarized interconnection between conductive layers and adjacent active devices.
Figure 40B:
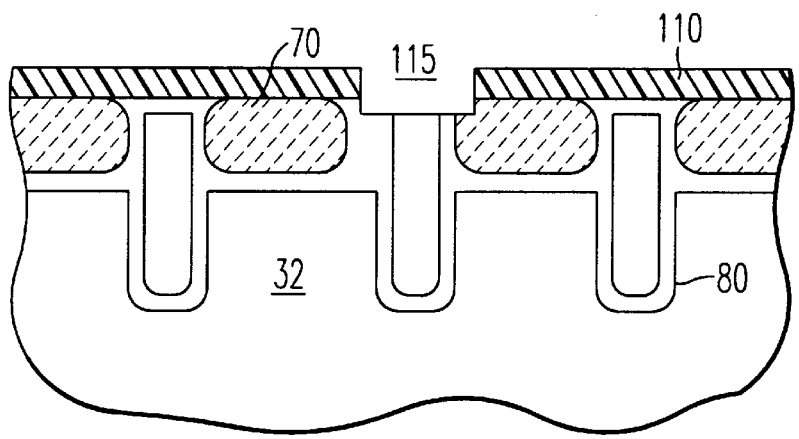
Figure 40C:
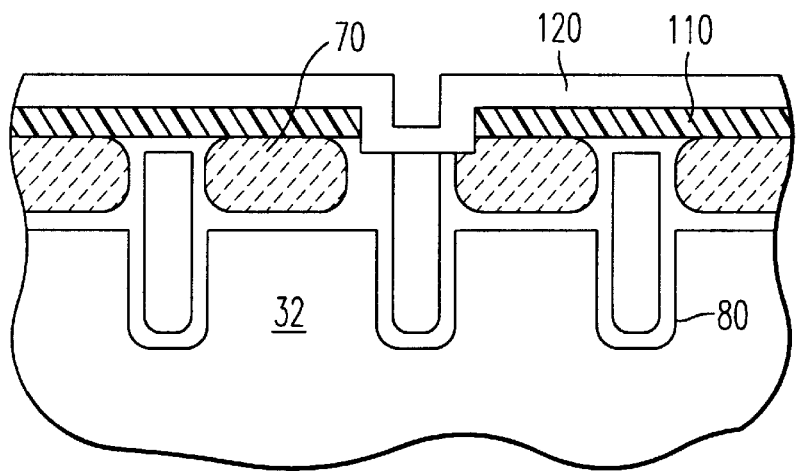

An alternative to the above-described structure and the method to create the above-described structure is illustrated in FIGS. 40(a)–(c). The alternative involves depositing a second conductive layer 110 directly above adjacent trench-isolated active devices so that the second conductive layer 110 and underlying conductive layers 70 in the isolated active regions are in contact Next, as illustrated in FIG. 40(b), a portion of the second conductive layer 110 is etched away where gaps 115 need to be (i.e., to isolate devices). The gap 115 is created by applying a photoresist mask over the structure, the photoresist mask exposing only the desired opening portion. A chlorine plasma ($Cl_2$/He) etch can be used to remove a second conductive layer 110 that is a polysilicon layer in the exposed portion. Once the desired gaps are created, any photoresist is removed and a dielectric blanket layer 120 is deposited over the structure as illustrated in FIG. 40(c).

It is to be appreciated by a person of ordinary skill in the art that a gap needs to be created where adjacent, distinct devices need to be isolated from one another rather than connected through the second conductive layer 110. On the other hand, where adjacent, distinct devices need to be connected, e.g., to form the input terminal of an inverter, a gap would not be created.

It is further to be appreciated by a person of ordinary skill in the art that the second conductive layer 110 described above to connect adjacent isolated devices can be thin. The second conductive layer 110 can be thin because the work function (i.e., thresholds) is defined by the underlying conductive layer (i.e., the gate) 70 and not the conductive layer strap 110 between the gates.

Multi-Level, Overlapping Interconnections

To this point, the discussion has focused on the method of formation of trench-isolated devices and methods to connect conductive layers, e.g., polysilicon gates, in the isolated devices to form specialized structures, e.g., inverters. With these principles in mind, the discussion now focuses on advanced methods of interconnecting multiple independent devices on an integrated circuit.

The invention relates to a method of producing smaller feature size structures by overlapping distinct interconnect layers. The invention recognizes that using overlapping interconnect layers allows contact openings to be spaced at the minimum allowable edge placement tolerance plus electrical isolation distance, because the multilevel structures contemplate that contact openings to interconnect material will be on different layers or levels. The invention also recognizes that using overlapping interconnect layers allows contacts to be packed in closer together to produce a dense structure.

The following method is described in terms of constructing the inverter portions of a 6T CMOS SRAM. It is to be recognized by a person of ordinary skill in the art the process of making multi-level overlapping interconnect structures is certainly not limited to 6T CMOS SRAM structures, but can function equally well in any environment requiring distinct interconnections (e.g., cache memory cells, DRAMs, multiplexors, etc.).

In FIG. 40, a structure was described wherein adjacent, trench-isolated devices in a semiconductor substrate were connected by a planarized conductive material strap connecting the gate portions of the distinct devices. FIGS. 41–80 extend upon that discussion in reference to the construction of multi-level, overlapping interconnects. It is to be appreciated that the following discussion can apply equally well to the alternative to planarized interconnects discussed with reference to FIGS. 40(a)–(c) and the accompanying text. For simplicity, the invention will be described starting principally from the structure described in FIG. 40.

Figure 41:
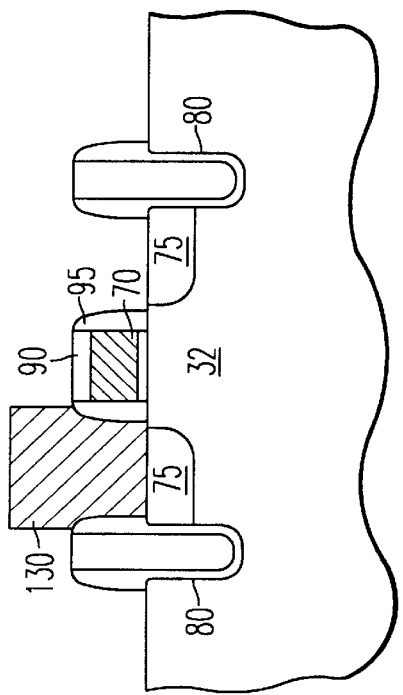
FIGS. 41–80 illustrate a method of formation of multi-level, overlapping interconnections between conductive regions of adjacent isolated devices in an integrated circuit.

FIG. 41 illustrates a planar side view of a portion of a semiconductor substrate 32 with an active device region isolated by trench-isolation techniques 80. The active device region includes diffusion region 75 and a gate 70 electrically insulated by a cap oxide 90 and lateral spacers 95. A photosensitive material 130 is deposited in a diffusion region, e.g., a drain region. The photosensitive material 130 may include, for example, photoresist or a photosensitive polyimide. The photosensitive material 130 is deposited in sufficient amount to account for minimum insulation thickness needed over the device's topology, and optionally an etch-back margin as the photosensitive material 130 may later be etched as will be discussed below. For example, in coating the photosensitive material 130 over the structure illustrated in FIG. 41, the thickness of the photosensitive material 130 is greater than the thickness of an eventual contact that will reside in an insulating or dielectric layer above the substrate plus an optional etch-back margin to account for subsequent etching. In this example, photosensitive material 130 may be approximately 10,000 Å in thickness, but other thicknesses may also be used (e.g., 5,000–20,000 Å).

Referring to FIG. 41, the photosensitive material 130 is patterned into posts above the underlying diffusion regions 75. Alignment of the post is accomplished using conventional alignment techniques practiced by those of ordinary skill in the art. The photosensitive material 130 is patterned into posts by the exposure of radiation, for example ultraviolet (UV) light, through a mask and by the subsequent development of the photosensitive material 130. In one embodiment, where the photosensitive material 130 contains photoresist, a clear field mask or an image reversal process using a positive tone mask may be used. Furthermore, the profile or cross-section dimension of the posts may be varied. For example, by controlling the exposure energy when exposing the photoresist through the mask. After being patterned, the photoresist posts 130 are preferably cured using a deep UV light exposure to harden the photoresist in the posts. Here, the polymers in the photoresist will become cross-linked during the deep UV cure so as to prevent the photoresist posts from later flowing or shrinking when exposed to elevated temperatures.

The photoresist post 130 is patterned such that the remaining photosensitive material after development defines the desired shapes and locations of openings for a layer to be formed over the surface of the structure. In other words, the photosensitive material 130 is patterned to define posts whose subsequent removal will create openings in an overlying layer formed over the diffusion region, so that appropriate contacts to diffusion may be formed. It is to be appreciated that the posts may be of any shape and that the term "post" is not meant to be limited in meaning, but rather includes, for example, any material used to define the location, size, and shape of openings for a subsequently formed layer.

Figure 42:
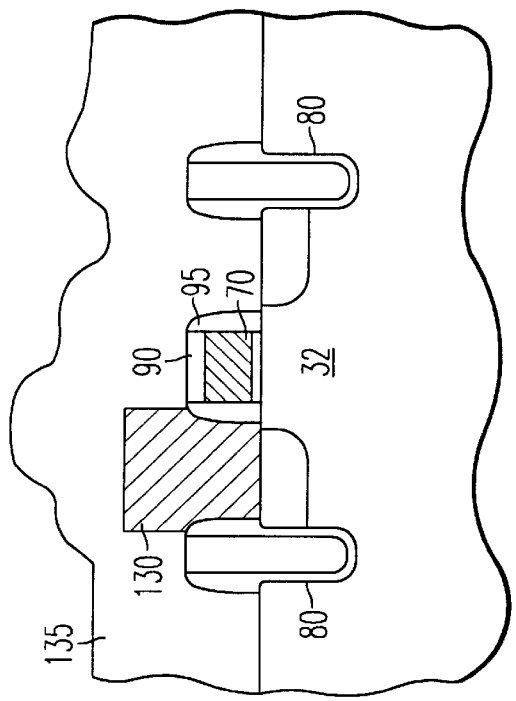

Referring to FIG. 42, a dielectric layer 135 is formed around the post of photosensitive material 130 over the diffusion region 75. The dielectric layer 135 can be any insulating material, for example, CVD $SiO_2$, SOG, TEOS, borophosphosilicate glass (BPSG), a low-temperature oxide (LTO), an oxynitride, or any other suitable dielectric material applied using suitable methods. Such a dielectric layer 135 may be multilayered by using a combination of two or more layers of suitable dielectric materials. It is to be appreciated that the formation of the layer which is to surround the post as well as any etch-back, polishing, and/or reflow of the overlying layer may involve heating the substrate to elevated temperatures. Accordingly, where the photosensitive material 130 used to create the posts contains photoresist, the posts are preferably hardened as discussed above using a deep UV cure so as to preserve the post during such processing steps. A thorough discussion of photosensitive post processing is presented in the patent application of James M. Cleeves, titled "Disposable Post Processing for Semiconductor Device Fabrication", filed Jan. 10, 1994, given Ser. No. 08/179,615 (now the subject of continuation application given Ser. No. 08/516,523), and assigned to Cypress Semiconductor, Inc., and the patent application of James M. Cleeves, titled "Disposable Posts for Self-Aligned Non-Enclosed Contacts", filed Dec. 29, 1995, given Ser. No. 08/581,061, and assigned to Cypress Semiconductor, Inc., both of which are incorporated herein by reference.

It is to be appreciated by a person of ordinary skill in the art that formation of contact openings to diffusion utilizing a method of forming and removing a photosensitive post is illustrative of a preferred method of establishing a contact opening. The invention certainly contemplates other methods of forming contact openings to diffusion, including conventional self-aligned contact techniques. Thus, the use of a photosensitive post process is meant to be exemplary and not limiting.

Figure 43:
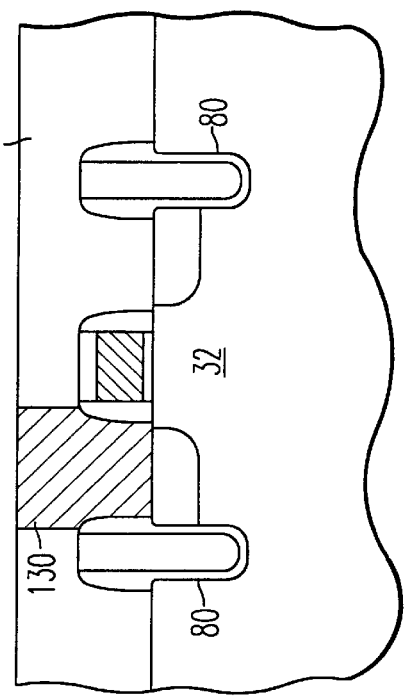
Figure 44:
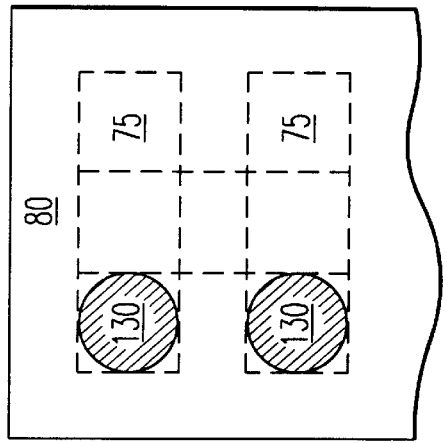
Figure 45:
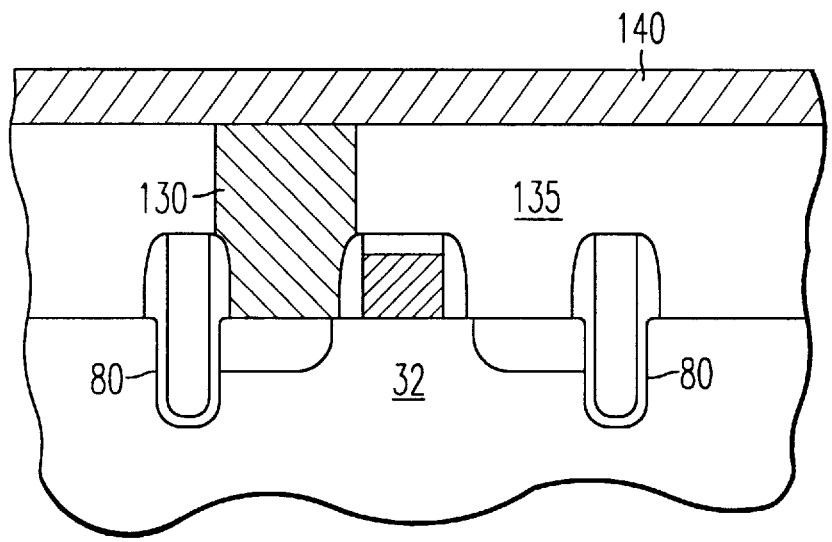

FIG. 43 illustrates the process wherein the dielectric layer 135 and the photosensitive material post 130 have been planarized. FIG. 44 illustrates a planar top view of the planarized structure. In FIG. 44, a pair of photosensitive material posts 130 are located in the diffusion regions of adjacent active device structures. Next, with reference to FIGS. 45 and 46, a photoresist mask 140 is applied over the substrate to expose a region 145 that contains the conductive layer strap between gates of distinct isolated devices.

Figure 46:
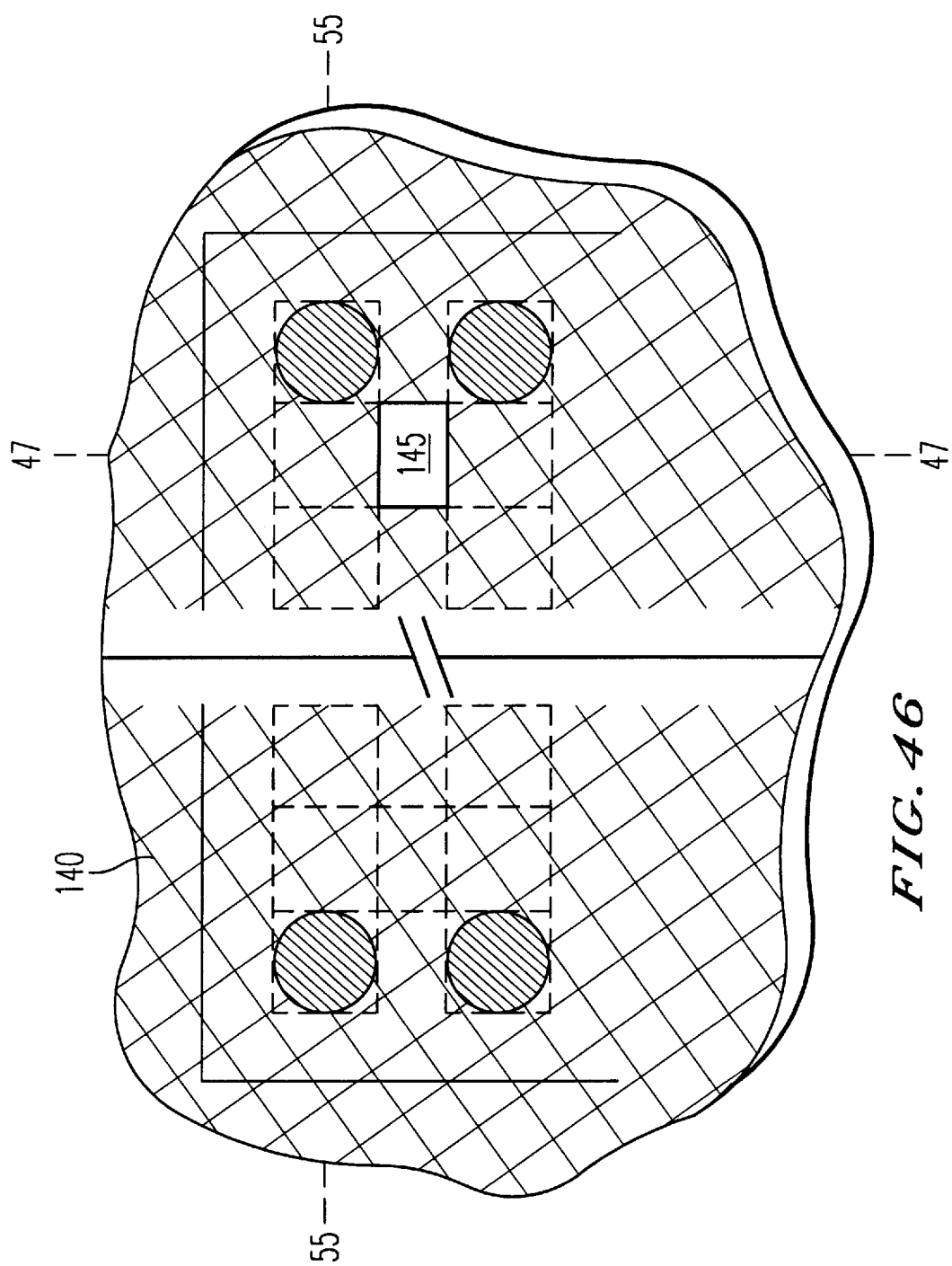

FIG. 47–54 represent the process steps of forming a contact to the conductive material strap between the gates of adjacent distinct active devices drawn through line A—A of FIG. 46 as well as an accompanying interconnect structure. FIGS. 55–62 illustrate the same process through line B—B of FIG. 46, showing the same contact formation to a diffusion region and interconnection from a diffusion region. FIGS. 47–54 and 55–62 will be described simultaneously.

Figure 47:
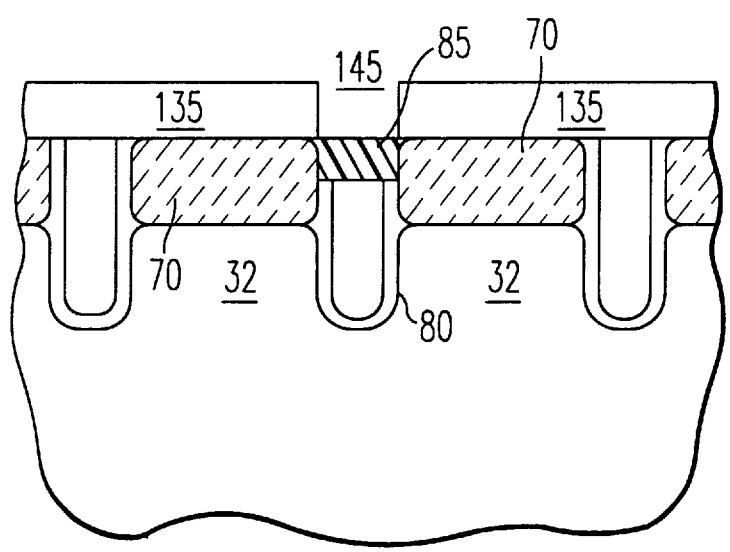

Referring to FIG. 47, an opening is made through the dielectric layer 135 to the conductive material strap 85 adjoining two adjacent conductive layers 70 in distinct active regions. Similarly, in FIG. 55, an opening 146 is made through the dielectric layer 135 to a diffusion region 75 in an active, isolated device, by removing the photosensitive post.

Figure 48:
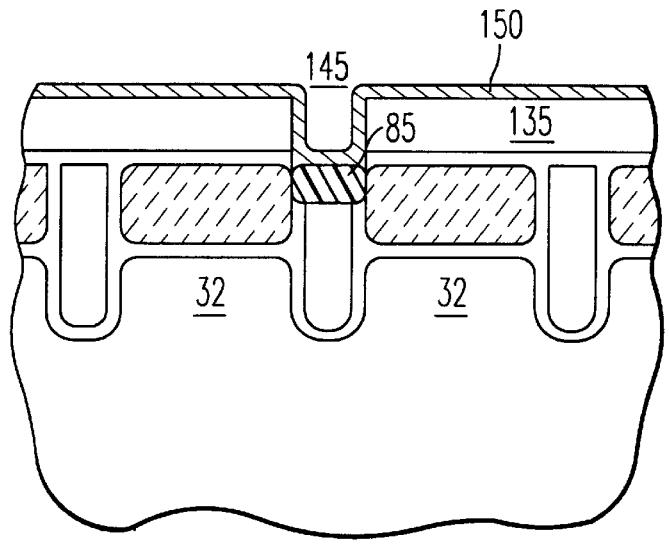
Figure 49:
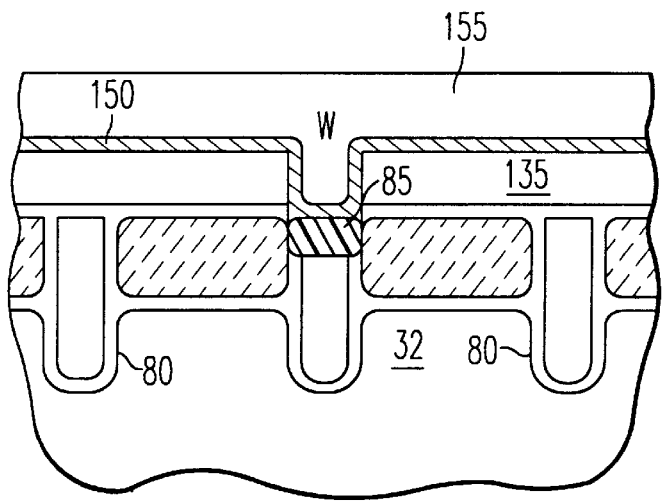

Referring to FIG. 48, a conductive material, preferably comprising a blanket layer of titanium 150, is deposited to a thickness of approximately 1400 Å over the dielectric layer and into the contact opening 145 to the conductive material strap 85. Similarly, in FIG. 56, a blanket layer 150 is deposited in the contact opening 146 to the diffusion region 75. Next, a titanium-tungsten or titanium-nitride barrier layer is deposited in the contact opening 146 then, referring to FIGS. 49 and 57, a blanket contact plug layer 155 comprising preferably tungsten is deposited to a thickness of approximately 8,000 Å.

Figure 50:
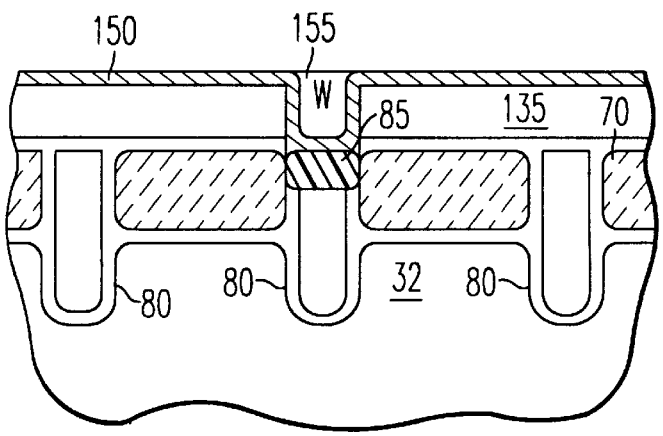
Figure 53:
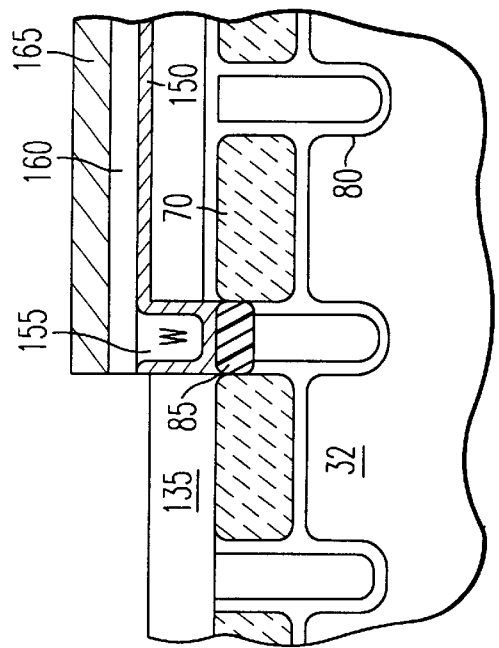
Figure 54:
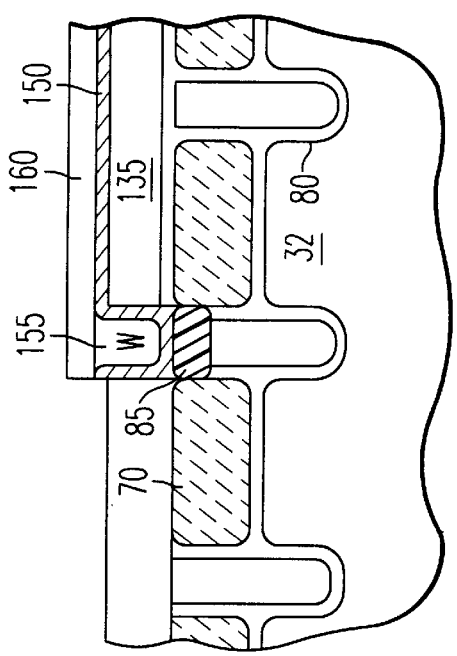
Figure 58:
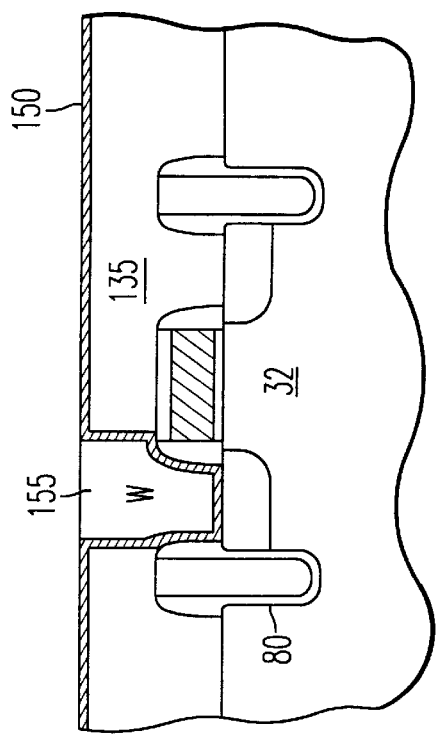

A selective etch-back process removes the contact plug layer 155 from the surface of the blanket layer 150 everywhere except within the respective contact openings 145, 146, to the conductive material strap 85 and the diffusion region 75, respectively. A selective etch, wherein the selectivity between tungsten and titanium is at least 5:1, is an $SF_6$ gas chemistry and etch parameters of a gas flow of 100–300 sccm, a chamber pressure of 200–400 mtorr, a 13.56 RF power of 350–550 watts and a chamber temperature of 30°–50°Celsius. The result of the etch-back process is illustrated in FIGS. 50 and 58.

The titanium, titanium-tungsten or -nitride, tungsten contact/interconnect described provides no interface barriers and minimal disruption of the planarity of the semiconductor device. The contact/interconnect is a described in detail in the patent application of Jonathan Bornstein and Roger Caldwell, titled "A Method for the Formation of Interconnects and Landing Pads Having a Thin, Conductive Film Underlying the Plug of an Associated Contact or Via Hole", and filed Aug. 29, 1994, given Ser. No. 08/297,626, and assigned to Cypress Semiconductor, Inc. It is to be appreciated by a person of ordinary skill in the art that the contact/interconnect material is not limited to Ti-W or TiN/Ti. Other methods include: (1) The use of conventional materials (i.e., aluminum) in the openings and as the interconnect; (2) the filling of the contact opening with a separate plug fill material such as tungsten and then depositing an aluminum metallization over the plug to form an interconnect (see for example U.S. Pat. Nos. 4,822,753 and 4,960,732); (3) the deposition of tungsten plug fill material over an underlying conductive film (e.g., titanium, titanium-nitride, titanium-tungsten, etc.) and the deposition of an additional conductive layer (e.g., titanium, titanium-nitride, titanium-tungsten, aluminum, etc.) over the plug and patterned to form an interconnect; and (4) the use of tungsten for both the plug fill material and the interconnect wiring layer (see for example, U.S. Pat. Nos. 4,960,732 and 5,183,782). Thus, the use of titanium and tungsten to form the contact and titanium as the interconnect material is meant to be exemplary and not limiting.

Figure 51:
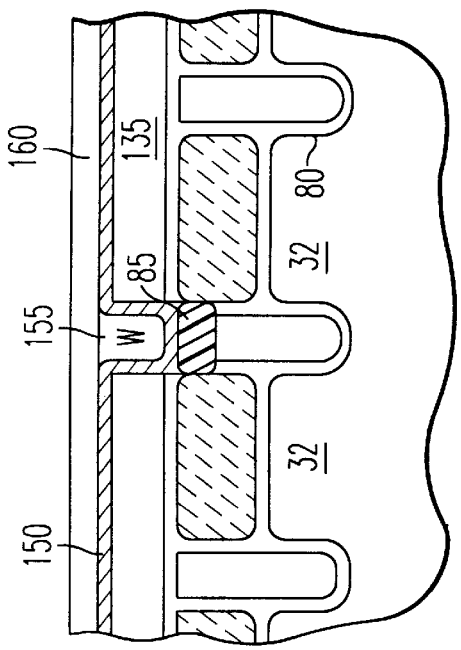
Figure 59:
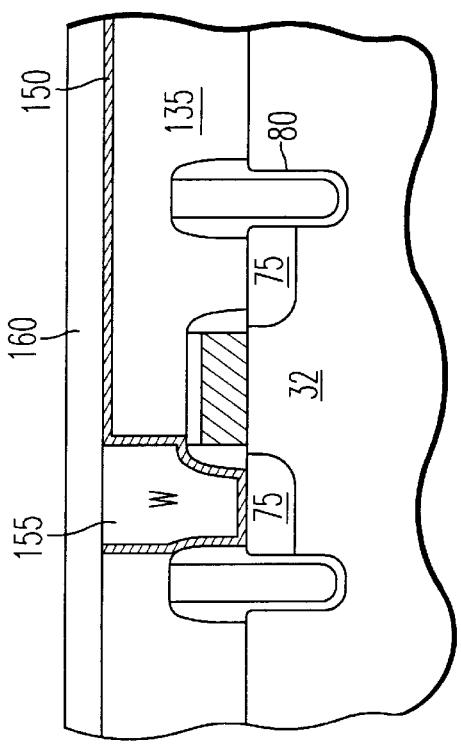
Figure 61:
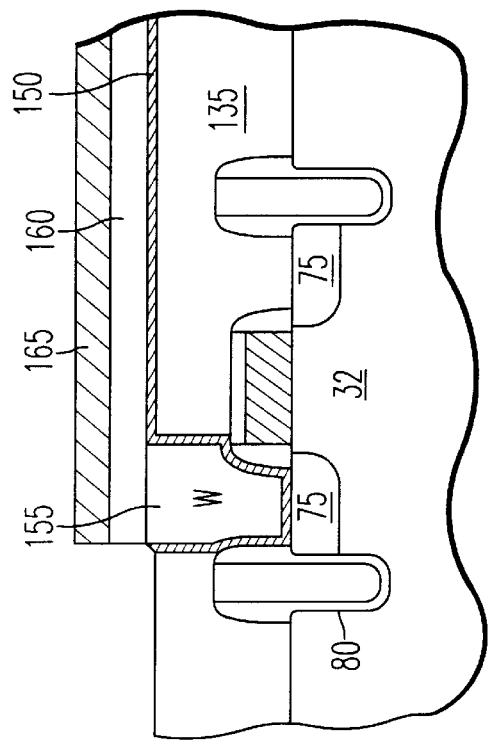

Referring to FIG. 51, a dielectric layer 160 is deposited over the semiconductor structure to a thickness of 2000 Å. Similarly, FIG. 59 illustrates the deposition of a dielectric layer 160 over the semiconductor substrate. The dielectric layer 160 may comprise a single oxide, or several layers formed by various methods. For example, one or more layers of oxide may be deposited by PECVD, thermal CVD, atmospheric pressure CVD, sub-atmospheric pressure CVD, for example, using TEOS and oxygen or TEOS and ozone chemistries. Additionally, one or more layers of dielectric material 160 may be a SOG layer. Other dielectrics, such as $Si_xN_y$, TEOS, $SiO_xN_y$, and ONO, may be used. Finally, the dielectric may further be doped, for example, BPSG, PSG, and BPTEOS.

Figure 52:
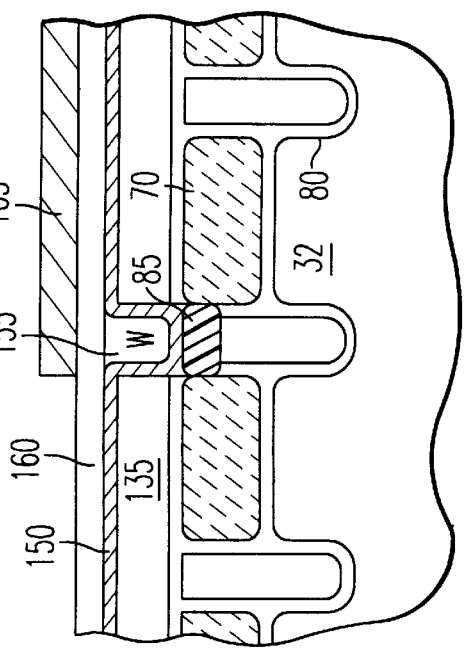
Figure 55:
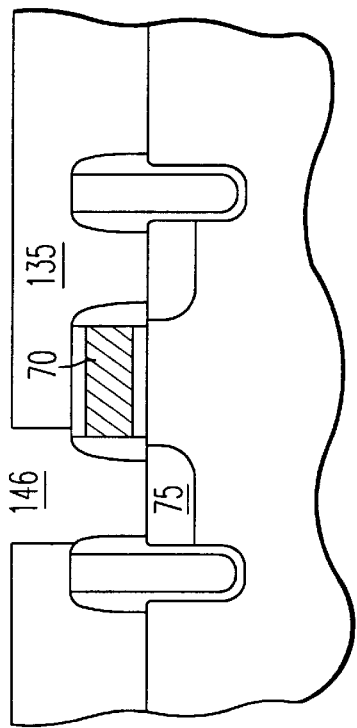
Figure 57:
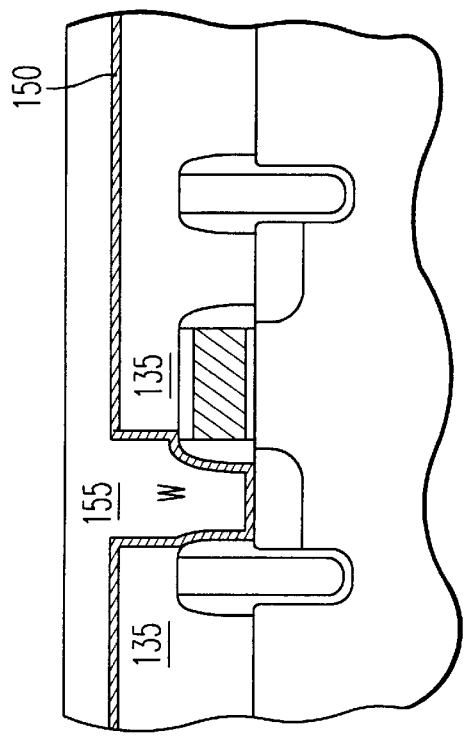
Figure 56:
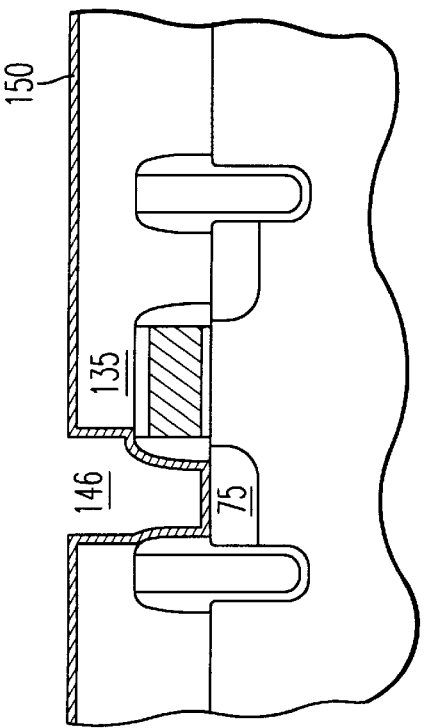
Figure 60:
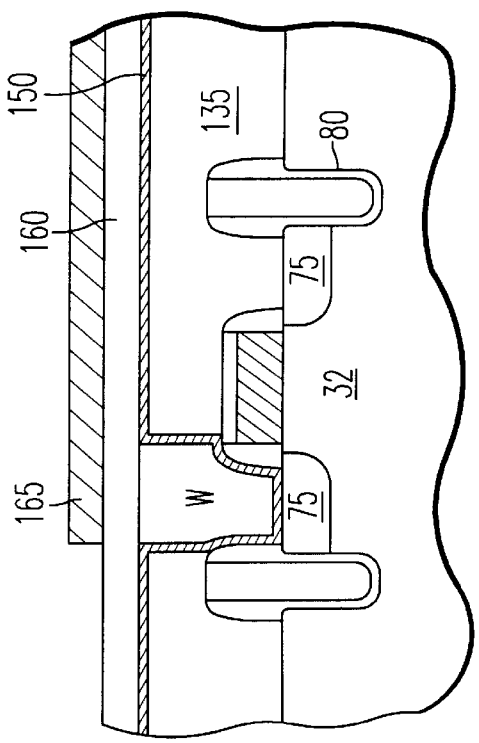
Figure 62:
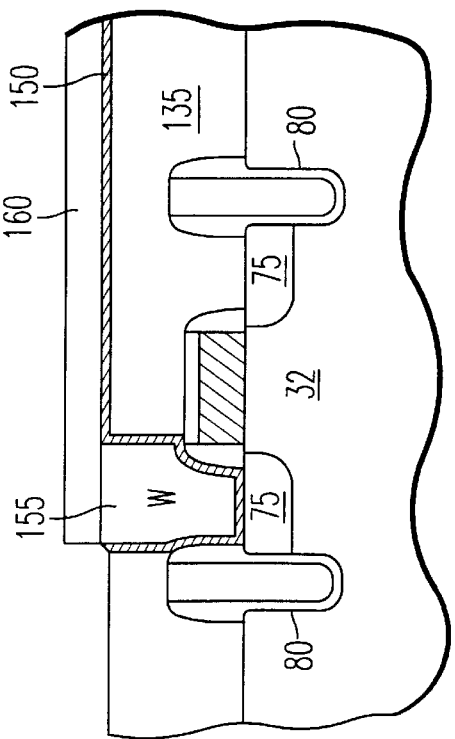

Referring to FIG. 52, a photoresist masking step is performed to apply photoresist mask 165 to a region that will serve as the interconnect layer. Similarly, FIG. 60 illustrates the formation of a photoresist mask above a region of the semiconductor substrate wherein a first interconnect layer will lie. Next, referring to FIGS. 53 and 61, the dielectric layer is etched using a suitable etch chemistry (e.g., $C_2F_6$/He at 900 mtorr for an oxide dielectric) to remove any and all exposed dielectric material of the dielectric layer 160. Next, referring to FIG. 53 and 62, the exposed portions of the conductive blanket layer 150 are etched with a suitable etch chemistry using conventional plasma etching equipment. Next, referring to FIGS. 54 and 62, the photoresist masking layer is stripped leaving a first interconnect material 150 beneath a dielectric layer 160.

Figure 63:
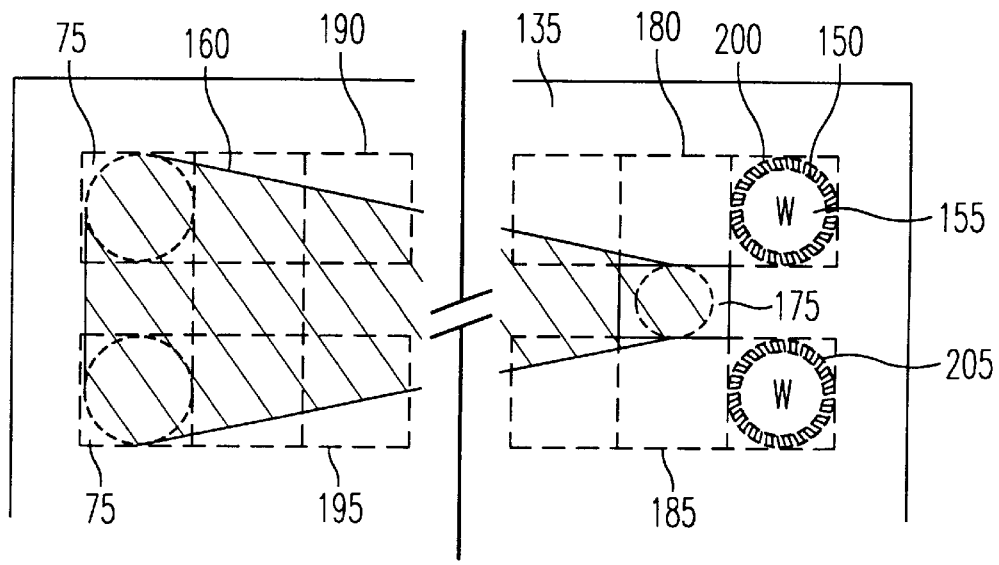

FIG. 63 illustrates a planar top view of a semiconductor substrate having a first interconnect material layer covered by dielectric 160. FIG. 63 illustrates several active regions 180, 185, 190, and 195, illustrated in ghost lines, and isolated from one another by trench isolation techniques. Each active region comprises a transistor with a gate region and diffusion (source/drain) regions. A blanket layer of dielectric 135 overlies the substrate. Two contact openings, 200 and 205 extend from the diffusion regions of active devices 180 and 185, respectively. Each contact opening, 200 and 205 contain a blanket layer 150 and plug layer 155. The first interconnect material layer did not extend horizontally to contact openings 200 and 205. FIG. 63 further shows a region 175 that includes a conductive material strap that connects gates 180 and 185. In FIG. 63, the first interconnect layer covered by dielectric layer 160 extends from diffusion regions 75 of adjacent, trench-isolated devices 190 and 195 to the conductive material strap between other adjacent gates of the active regions 180 and 185.

To this point, a first interconnect material layer connects diffusion regions of adjacent, trench isolated active devices 190 and 195 and the conductive material strap between other adjacent gates of devices 180 and 185. The interconnect material layer can be, for example, coupling the drain regions of active devices 190 and 195 with the gate portions of active devices 180 and 185. In this example, the first interconnect material layer comprises a portion of an inverter that can be used, for example, as part of a 6T SRAM.

Figure 64:
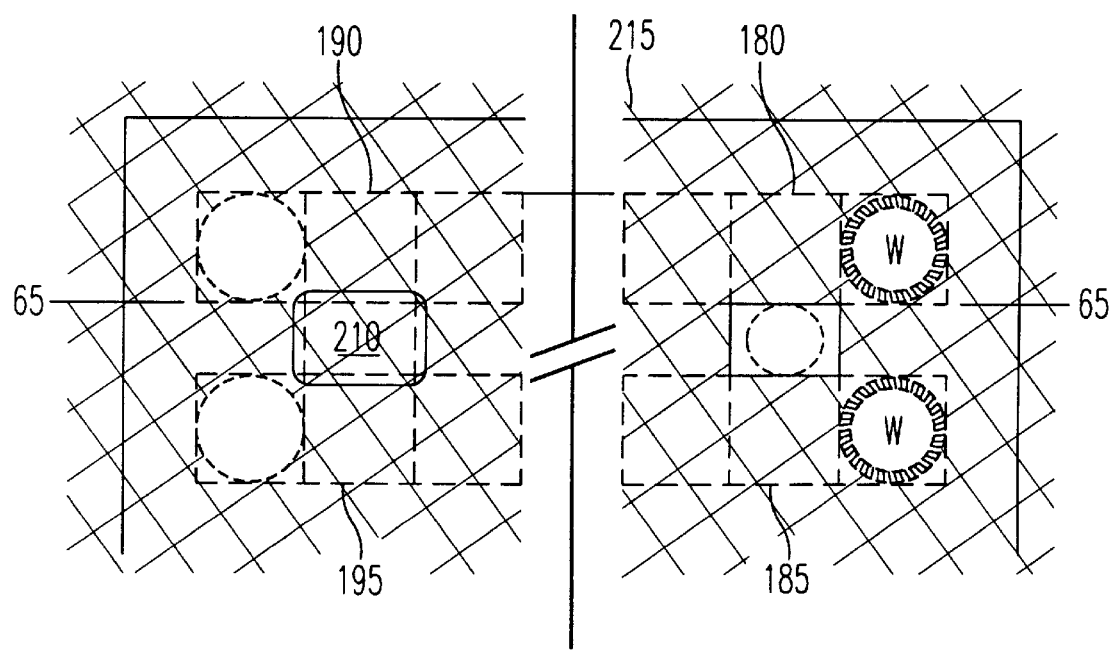

Referring to FIG. 64, a photoresist masking layer 215 is deposited over the substrate to expose a portion of the substrate 210 that is the conductive material strap between nearby adjacent gates of devices 190 and 195. The method contemplates that a contact opening will be made to the conductive material strap as part of the second interconnect material layer.

Figure 65:
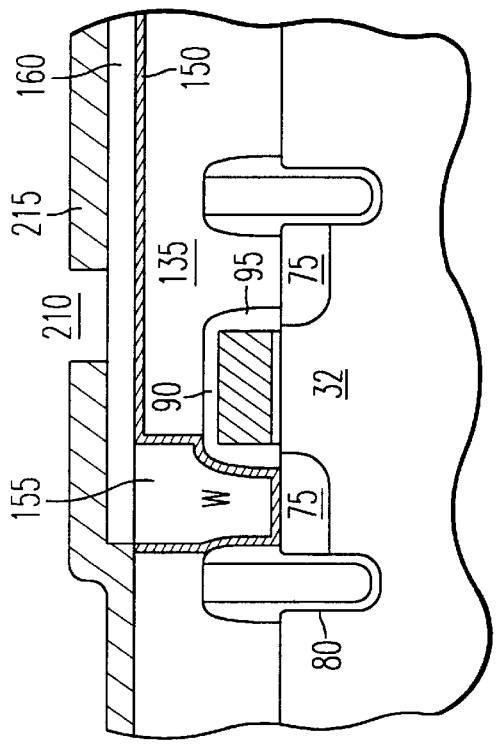

FIG. 65 is a planar side view of a portion of a semiconductor substrate taken through line C—C of FIG. 64. FIG. 65 illustrates the photoresist masking layer 215 deposited over the substrate to expose a portion 210 over the conductive material strap between nearby adjacent gates of devices 190 and 195. FIG. 65 further shows a first interconnect layer 150 covered by a dielectric 160, and a contact to diffusion, the contact comprised of the blanket layer material 150 and a contact plug layer 155.

Figure 66:
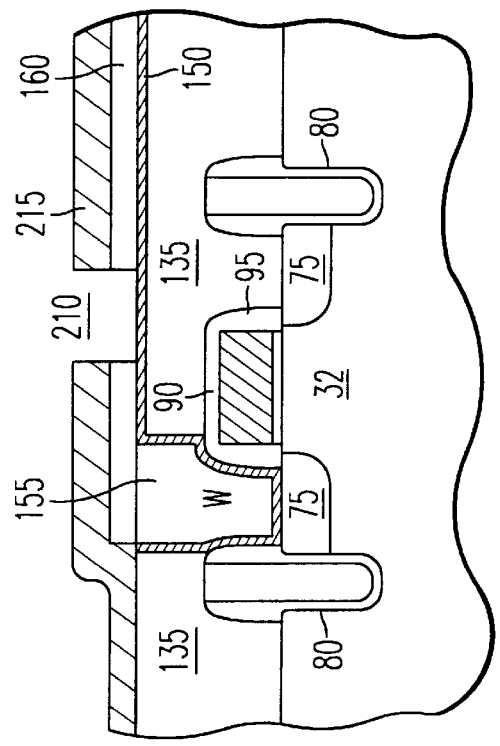
Figure 67:
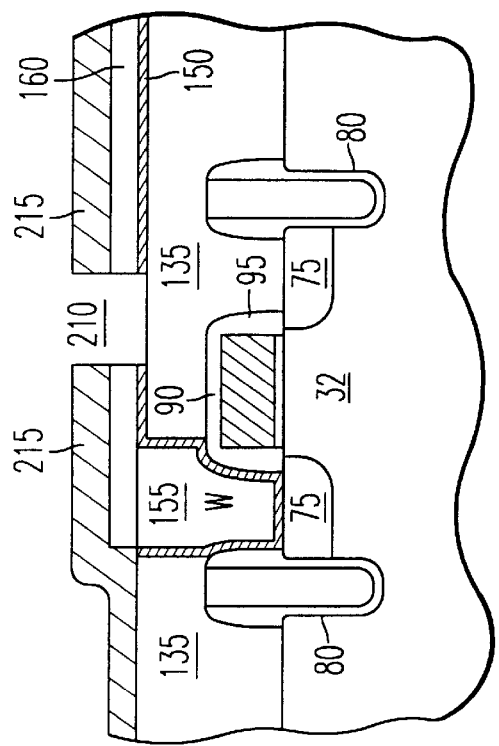
Figure 68:
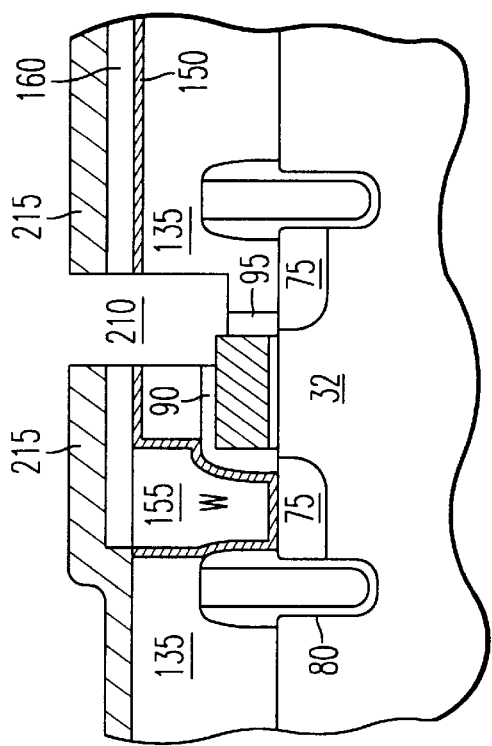
Figure 69:
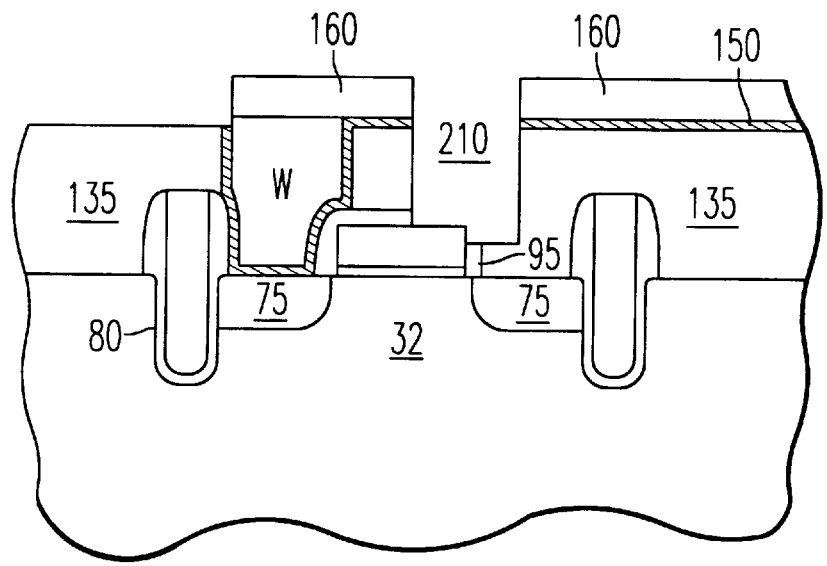

FIG. 66 illustates a conventional etch of the exposed dielectric material 160 in opening 210. The etch parameters for this etch will depend on the type of dielectric material used. For example, if the dielectic is an oxide, a $C_2F_6$/He etch chemistry at 900 mtorr may be used. Next, referring to FIG. 67, the exposed portions of the conductive blanket layer 150 are etched with a suitable etch chemistry using conventional plasma etching equipment. Referring to FIG. 68, exposed dielectric layer 135 and cap and spacer portions 90 and 95, respectively, are etched using a suitable etch chemistry (e.g., $C_2F_6$/He at 900 mtorr for an oxide) to reveal the underlying conductive material strap connecting the gate portions of adjacent transistors. Finally, referring to FIG. 69, the photoresist mask is removed to reveal a contact opening 210 to the conductive material strap.

Figure 70:
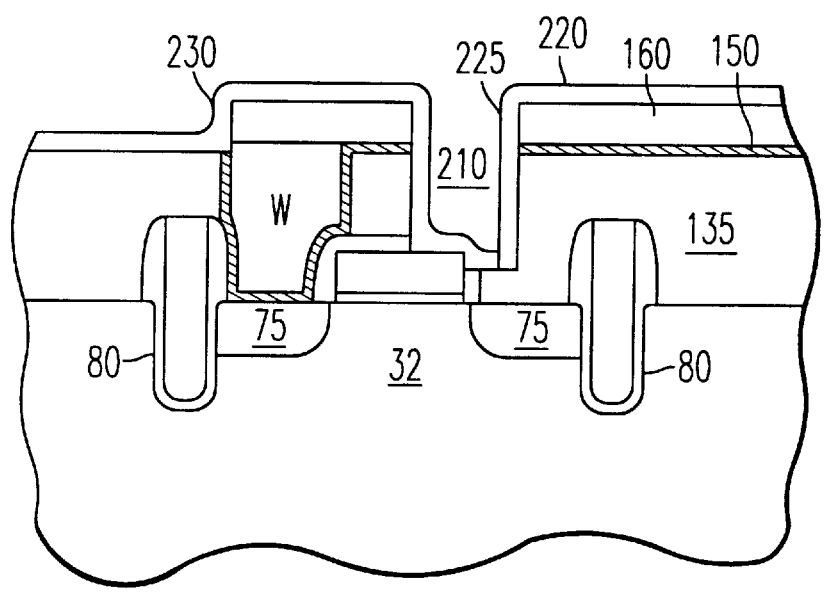

FIG. 70 illustrates the formation of a spacer dielectric material 220 formed on the structure and in the contact opening 210. The dielectric material 220 must be formed as a spacer portion 225 in the contact opening 210 and around the edge 230 of the first interconnect material layer 150. The dielectric material 220 is deposited, for example by CVD, PECVD, thermal CVD, or sputtering. The invention contemplates that the dielectric spacer portion 225 in the contact opening 210 as well as around the edge 230 of the first interconnect material layer 150 be thick enough to electrically insulate the contact opening and hold off any operating voltage. In the example that is a 6T SRAM, a dielectric layer of approximately 1000 Å thickness is sufficient.

Figure 71:
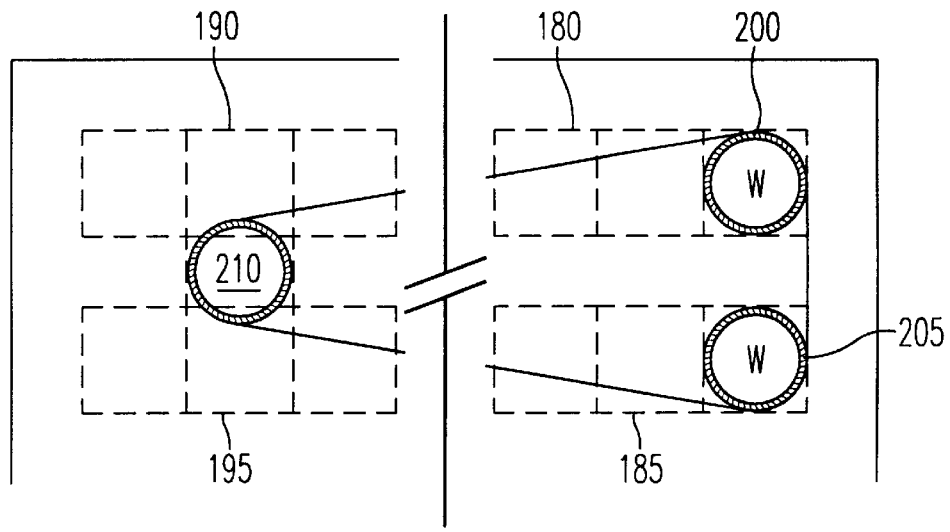
Figure 72:
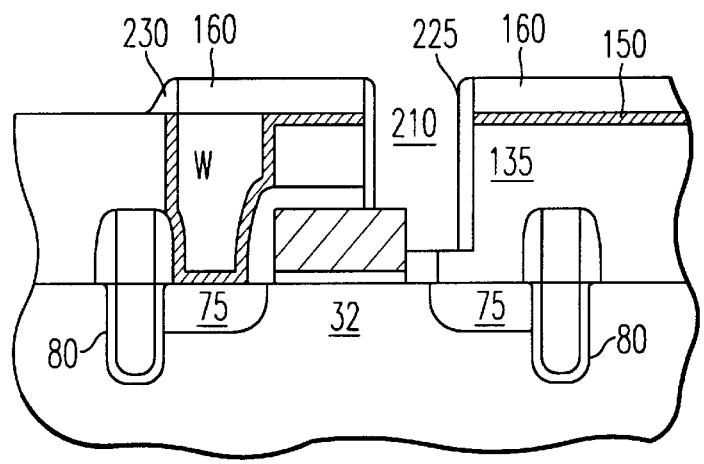

The deposition of the dielectric material 220 is followed by an etch in the contact opening 210 of that portion of the dielectric material 220 deposited or grown on the conductive material strap and any contact openings that are to be connected by the second interconnect material layer. With respect to the contact opening 210, the etch is of the horizontal material (i.e., anisotropic) overlying the conductive material and not of the spacer portions. Conventional dielectric etch parameters (e.g., $C_2F_6$/He at 900 mtorr for an oxide) may be used to accomplish the dielectric etch. FIG. 71 illustrates a planar top view of a portion of a semiconductor substrate wherein the dielectric etch exposes regions 210, above the conductive material strap connecting adjacent devices 190 and 195, and regions 200 and 205, above diffusion regions of adjacent devices 180 and 185. FIG. 72 illustrates a planar side view wherein the conductive material strap is exposed.

Figure 73:
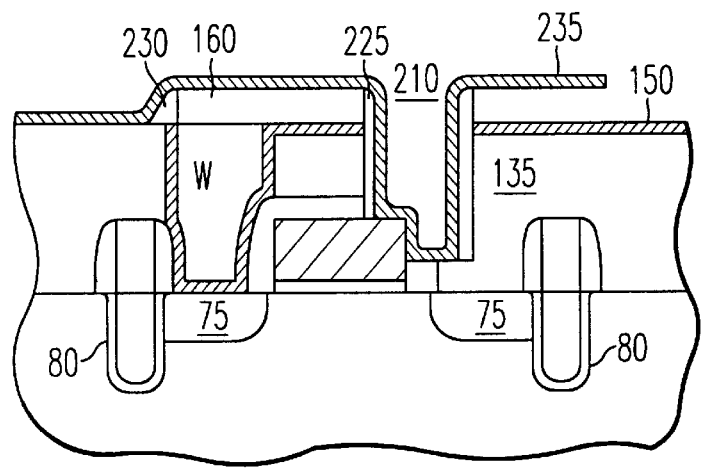

Referring to FIG. 73, the photoresist mask is removed and a conductive material, preferably comprising a blanket layer of titanium 235, is deposited to a thickness of approximately 1400 Å over the dielectric layer 160 and over spacer portions 225 and 230 and into the contact opening 210 to the conductive material strap. The deposited conductive material 235 is the second layer interconnect material, so the conductive material 235 is further deposited over preformed contacts or into other contact openings.

Figure 74:
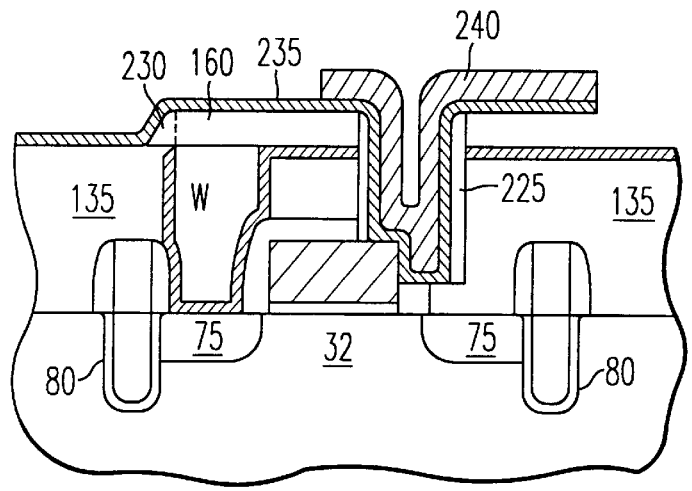
Figure 75:
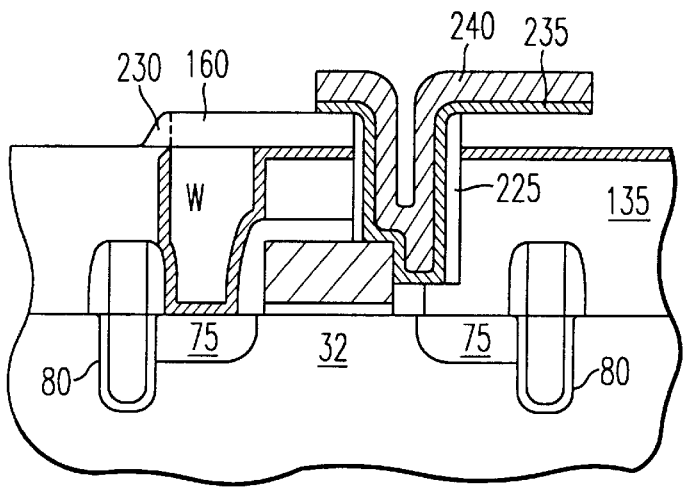
Figure 76:
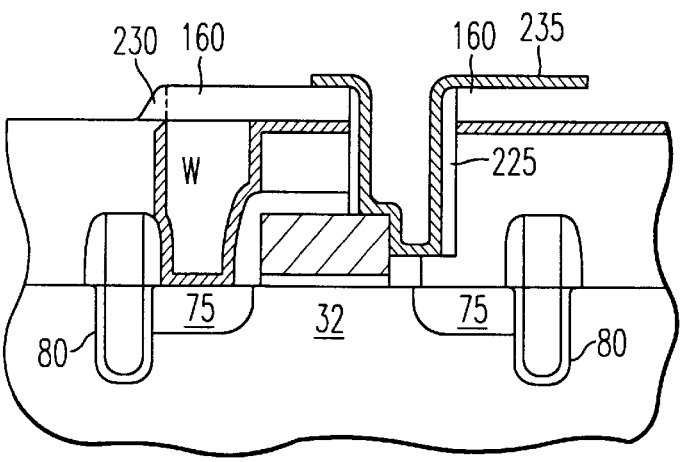

Next, a photoresist mask is formed over the substrate to form the second interconnect material layer 235. Referring to FIG. 74, areas where the second interconnect material layer 235 is to be removed are exposed and the second interconnect material layer 235 is protected by the photoresist mask 240. FIG. 75 illustrates the etching of the unwanted blanket layer of second interconnect material using conventional etch chemistries and FIG. 76 presents the structure with the photoresist mask removed.

Figure 77:
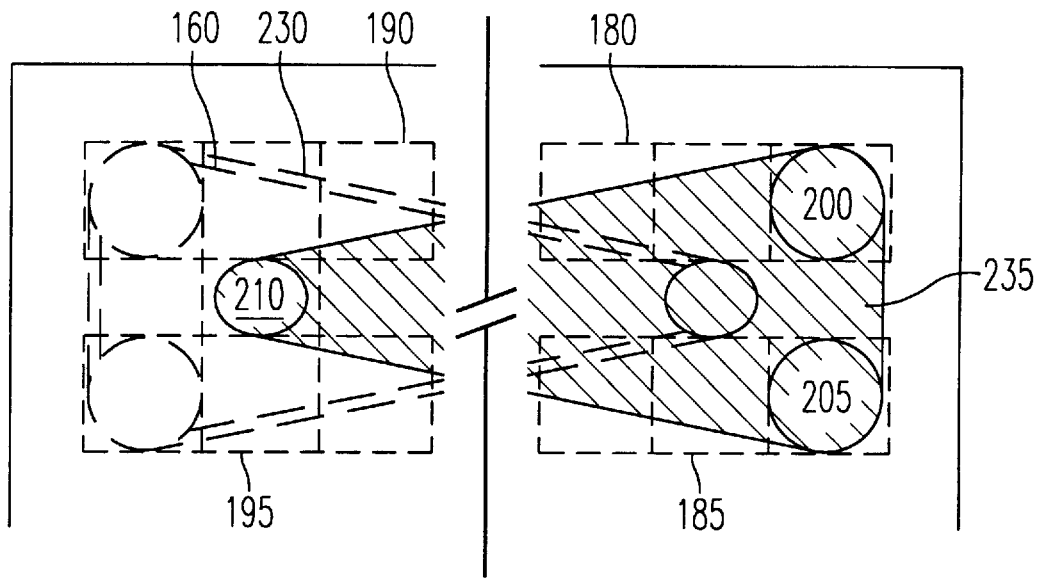

FIG. 77 illustrates a planar top view of a portion of a semiconductor substrate having first and second interconnect layers wherein the second interconnect layer overlies the first interconnect layer. The second interconnect material layer 235 connects regions 210, above the conductive material strap connecting adjacent devices 190 and 195, and regions 200 and 205, above diffusion regions of adjacent devices 180 and 185. The first interconnect material layer 160 is shown in ghost lines, because the first interconnect material layer is, in actuality, covered by a dielectric layer. The first interconnect material layer 160 connects diffusion regions of adjacent, trench isolated active devices 190 and 195 and the conductive material strap between nearby adjacent gates of devices 180 and 185. Adjacent to the first interconnect material layer 160 is spacer edge portion 230, also shown in ghost lines for clarity. The first interconnect material layer 160 can be, for example, coupling the drain regions of active devices 190 and 195 with the gate portions of active 180 and 185. The second interconnect material layer 235 can be, for example, coupling the drain regions of active devices 180 and 185 with the gate portions of active devices 190 and 195. In this example, the first and second interconnect material layers can comprise a pair of inverters that are used, for example, as part of a 6T SRAM.

Figure 78:
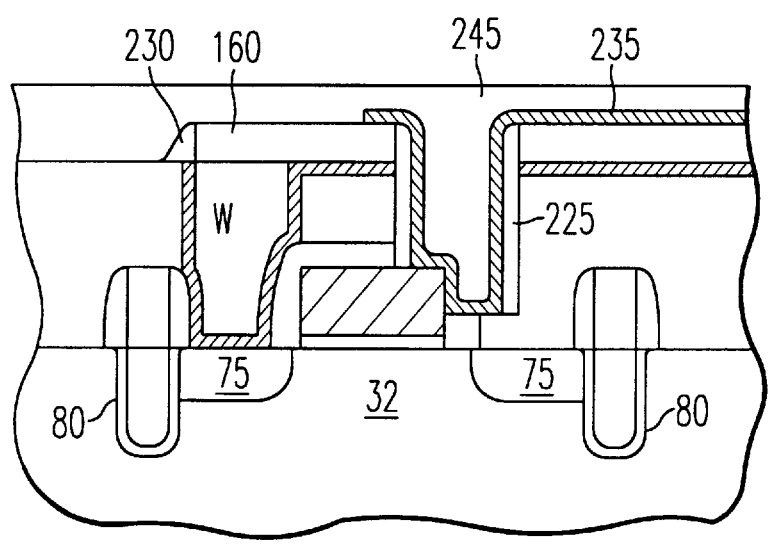
Figure 79:
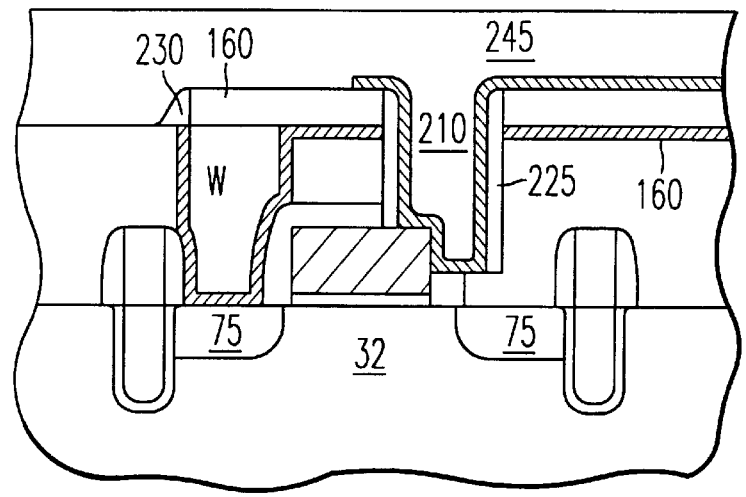

Referring to FIG. 78, a dielectric layer 245 is next deposited over the substrate. The dielectric layer 245 can be of any suitable dielectric material mentioned above, including an oxide or SOG. In one embodiment, a SOG layer is first formed over the interconnect and subsequently cured, for example, at approximately 350° Celsius, as is required to withstand subsequent polishing. This first SOG layer is preferable since it is spun-on as a liquid and hence, thoroughly fills and covers the surface of the substrate. Once the SOG is down and cured, an optional silicon dioxide layer can be deposited over the first SOG layer using a plasma-enhanced chemical vapor deposition (PECVD). Alternatively, the silicon dioxide may be put down first, followed by the SOG layer. The dielectric layer is preferably planarized (FIG. 79) using suitable methods, for example, with a planarizing etch-back, flowable SOG, or polishing technique.

Figure 80:
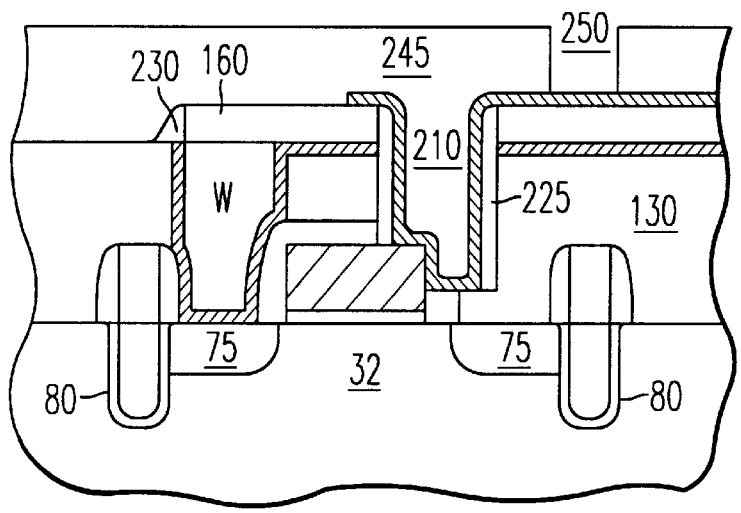

FIG. 80 illustrates a planar side view of a portion of a semiconductor substrate wherein a contact opening 250 is made to the second level interconnect layer 235 using conventional etching techniques. The contact opening 250 to the second level interconnect layer 235 might be, for example, to connect the interconnect to a bit line in a memory array.

Figure 81:
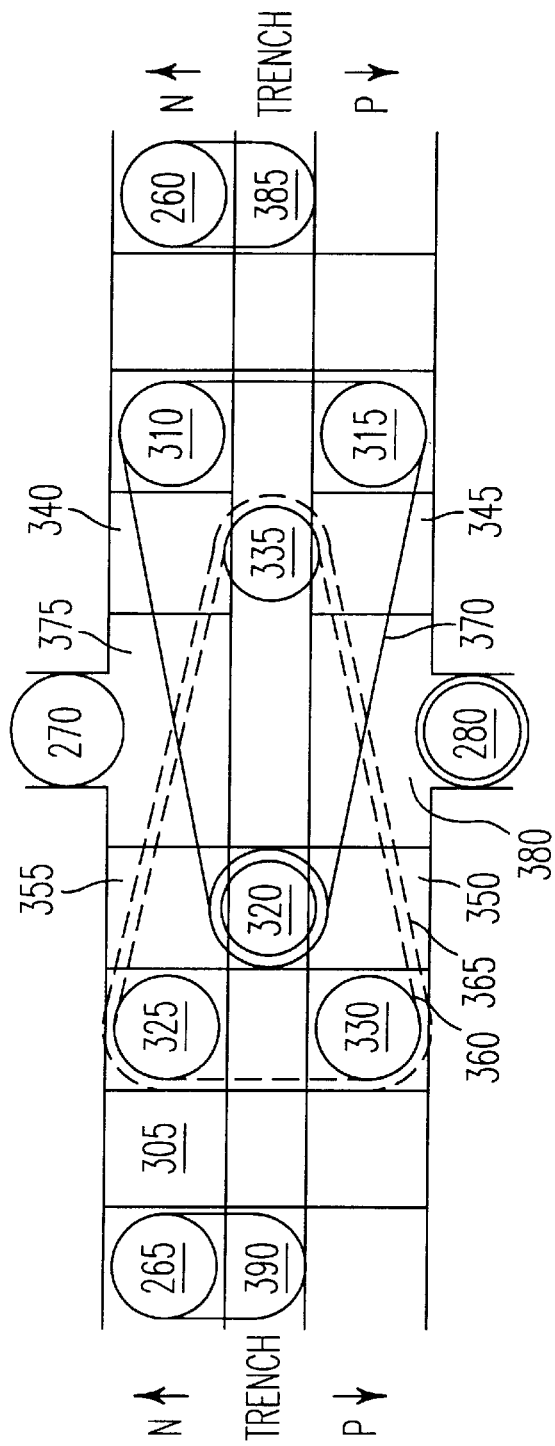
FIG. 81 illustrates a planar top view of 6T CMOS SRAM constructed by the method contemplated by the invention.

FIG. 81 illustrates a planar top view of a trench-isolated 6T CMOS SRAM that is constructed using the method described in the invention. The gates of the six transistors that make up the SRAM are 300, 305, 340, 345, 350, 355. Transistors 300, 305, and 340 are N-transistors; transistors 345, 350, and 355 are P-transistors. In FIG. 81, all contact openings and local interconnect layers are visible for the purpose of understanding the structure. It is to be appreciated by a person of ordinary skill in the art that the contact openings would be covered by metal or interconnect material and that the interconnect material layers would similarly be covered by a dielectric layer as described above with reference to the formation of the multi-level, overlapping interconnect structures.

The first level interconnect material layer 360 is shown in ghost lines as is the layer of dielectric material 365 that surrounds first level interconnect material layer 360. The first level interconnect material layer 360 forms a portion of an inverter in the SRAM structure. The first level interconnect material layer 360 connects drain 325 of N-transistor 355 with the drain 330 of P-transistor 350 and with the conductive material strap 335 that connects the gates of transistors 340 and 345. The second level interconnect material layer 370 connects drain 310 of N-transistor 340 with the drain 315 of P-transistor 345 and with the conductive material strap 320 that connects the gates of transistors 350 and 355. A VCC power line 280 is connected to the shared source region 380 of P-transistors 345 and 350 and a $V_{SS}$ line 270 is connected to the shared source region 375 of N-transistors 340 and 355.

The bit lines of the 6T CMOS SRAM shown in FIG. 81 are formed in a conventional metallization step to source regions 260 and 265 of transistors 300 and 305, respectively. The contact openings to the source regions 260 and 265 are formed with the contact openings to the drain regions 310, 315, 325, and 330 as described above (see FIGS. 41–50 and accompanying text). In the example shown in FIG. 81, the interconnect material layers/landing pads 385 and 390 are constructed of the second interconnect material layer processing steps described above (see FIGS. 72–77 and accompanying text). The bit lines are formed with a conventional metallization techniques to the interconnect material layers/landing pads 385 and 390. Similarly, the word line is formed to the gates of transistors 300 and 305 by conventional metallization techniques.

Figure 1:
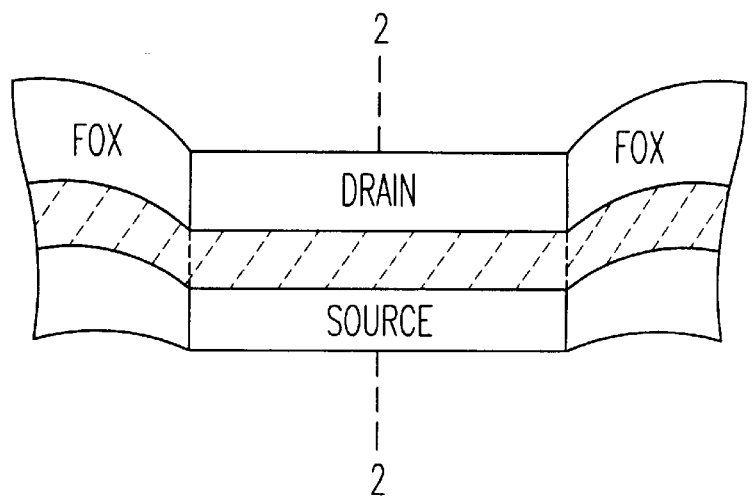
FIG. 1 illustrates a planar top view of a prior art active device isolated by semi-recessed LOCOS isolation.
Figure 2:
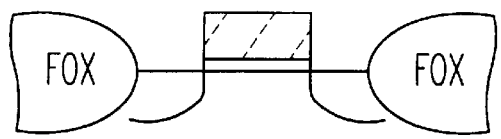
FIG. 2 illustrates a planar side view of the prior art structure of FIG. 1 taken through line A—A.
Figure 3:
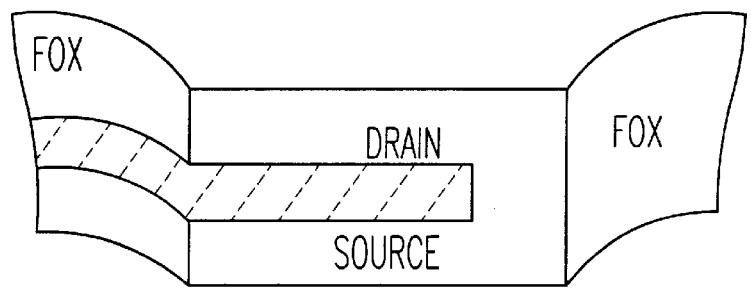
FIGS. 3 illustrates a planar top view of a prior art active device region isolated by semi-recessed LOCOS isolation wherein the conductive material does not extend through the length of the device region.
Figure 4:
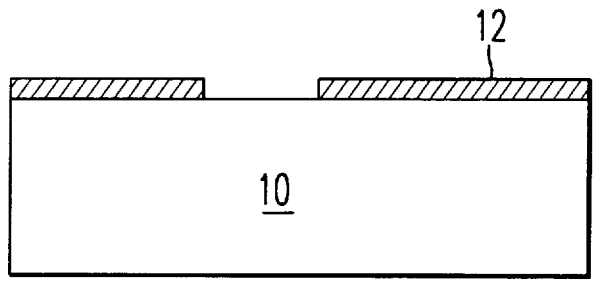
Figure 5:
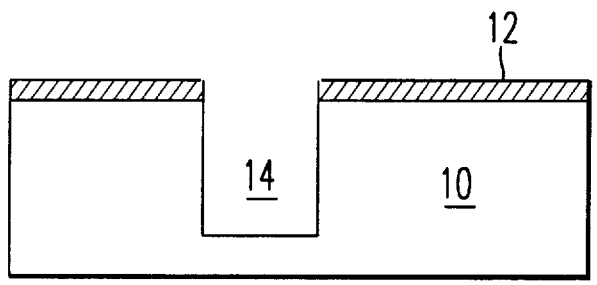
Figure 6:
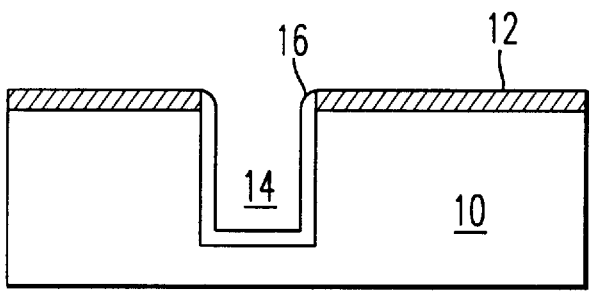
Figure 7:
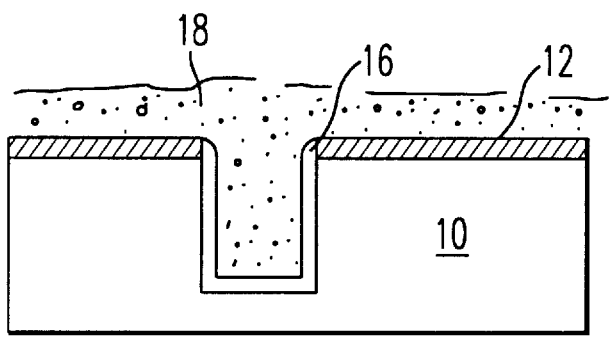
Figure 8:
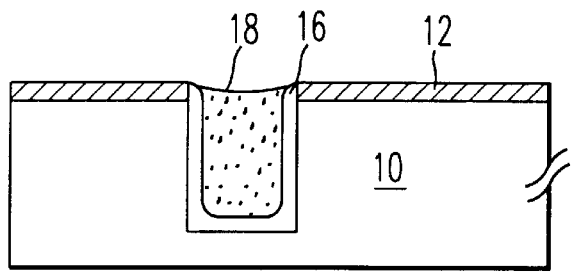
Figure 9:
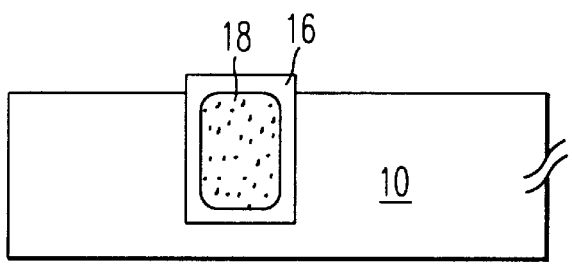
Figure 10:
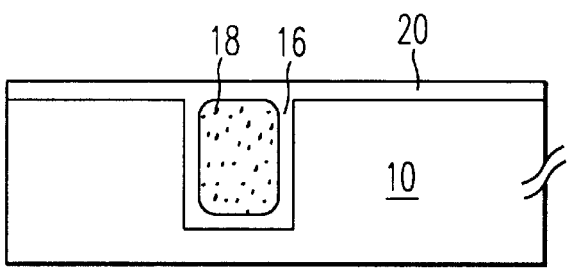
Figure 11:
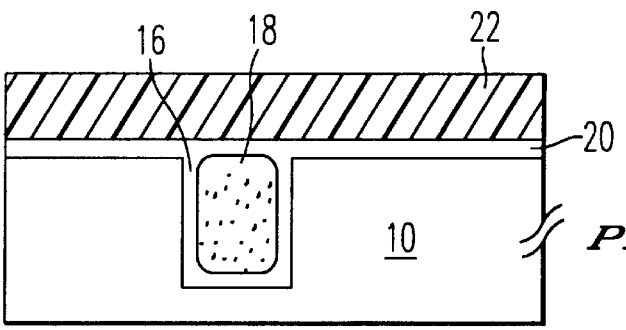
Figure 12:
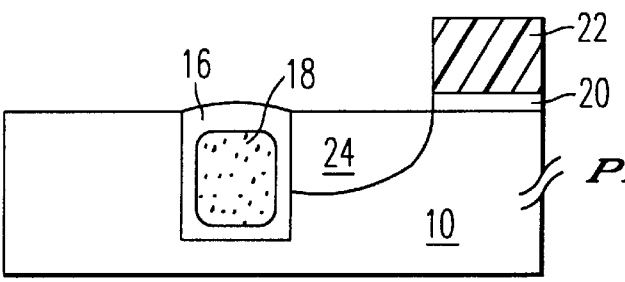
Figure 13A:
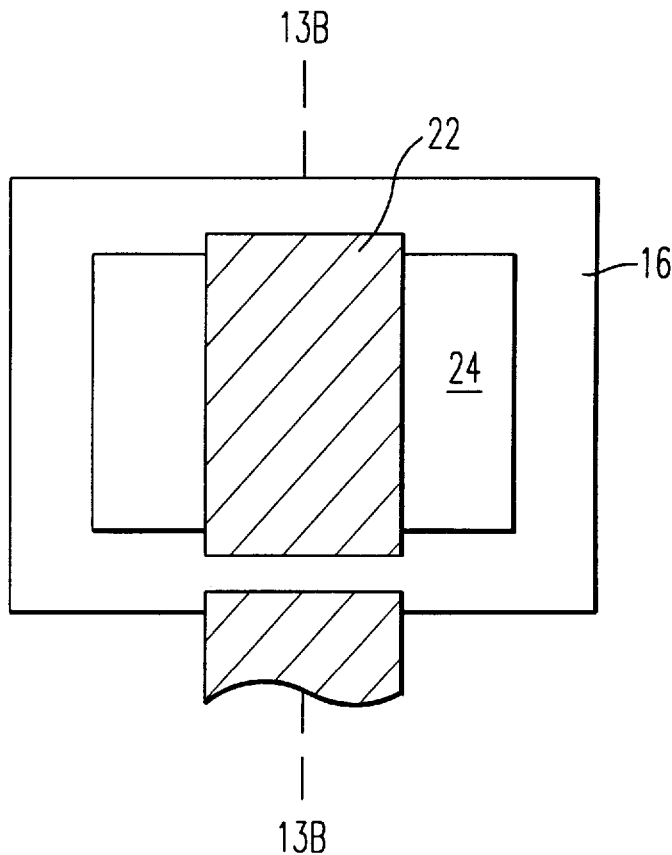
FIG. 13(a) illustrates a planar top view of an active device region of a portion of a semiconductor substrate having a gate and source/drain regions.
Figure 13B:
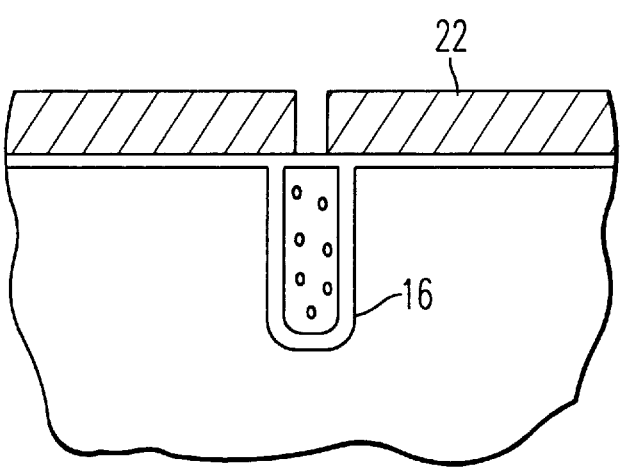
Figure 14A:
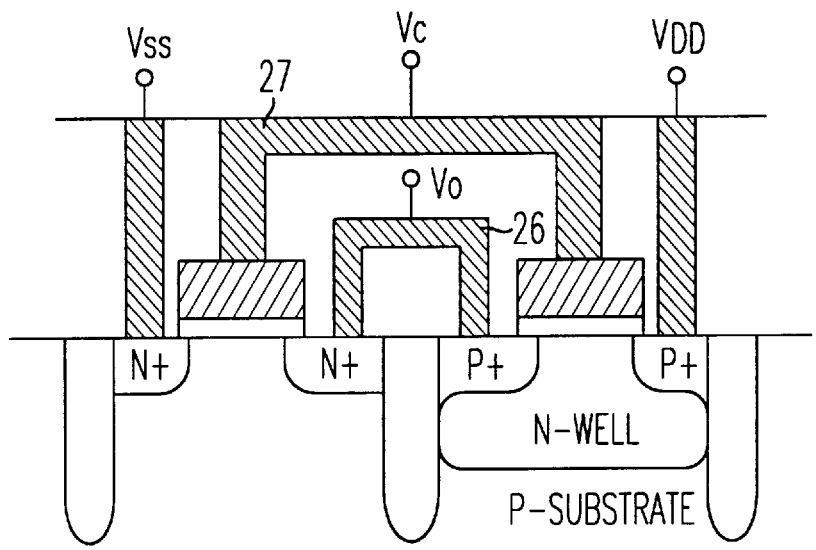
FIG. 14(a) illustrates a planar side view of a CMOS inverter.
Figure 14B:
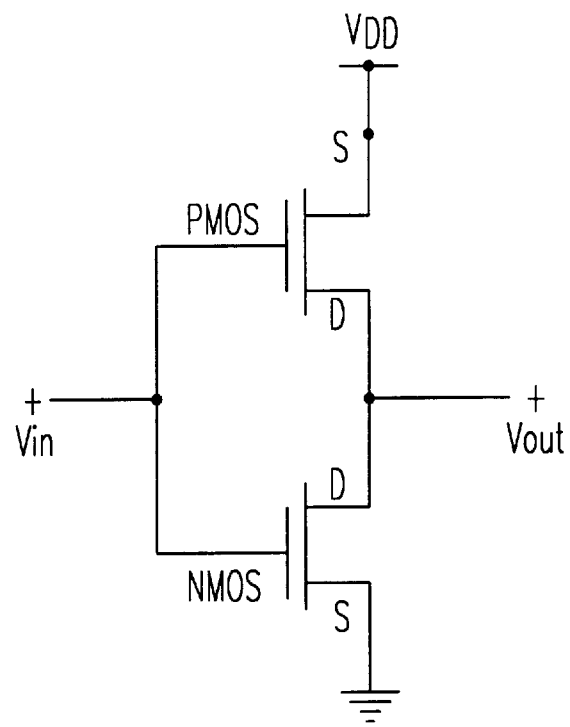
FIG. 14(b) illustrates a schematic of a CMOS inverter.
Figure 15A:
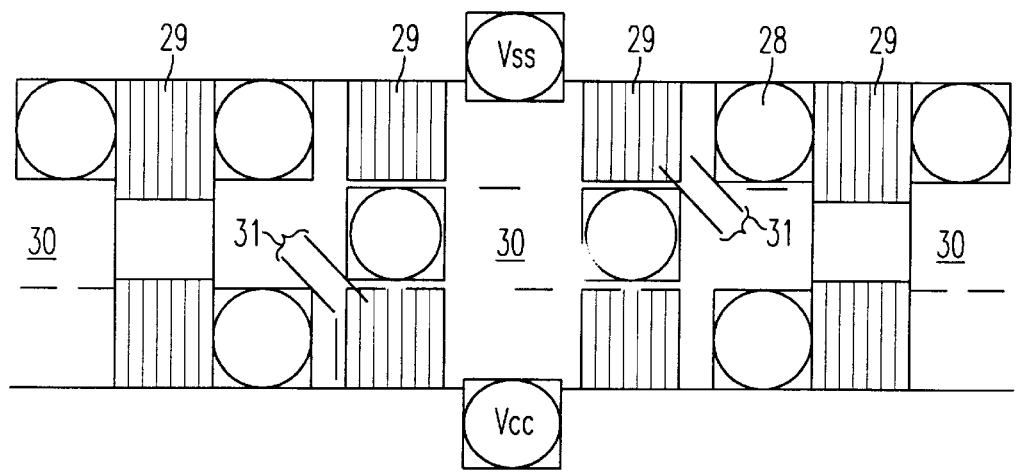
FIG. 15(a) illustrates a planar top view of a prior art 6 transistor, trench-isolated, CMOS SRAM.
Figure 15B:
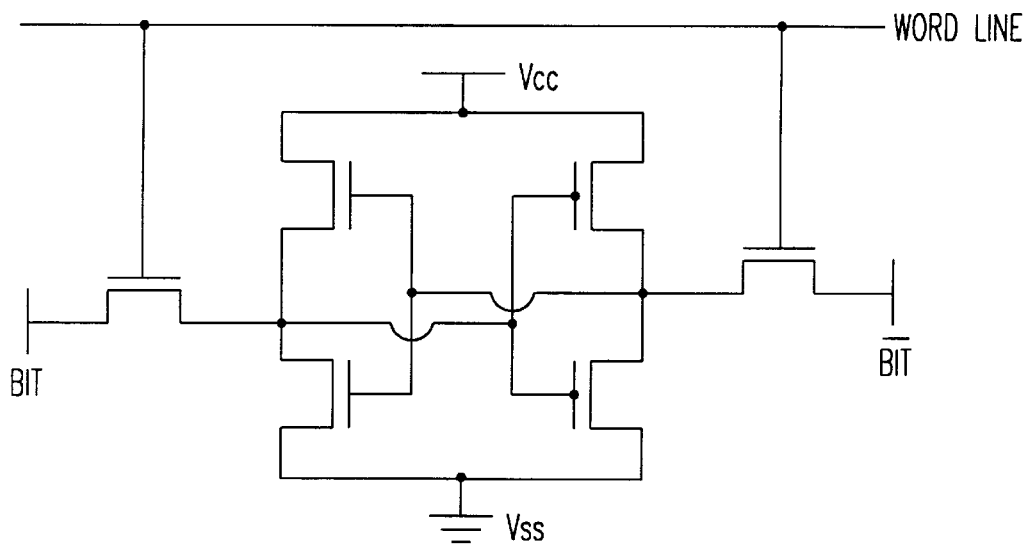
FIG. 15(b) illustrates a schematic of a 6 transistor, CMOS SRAM.
Figure 15C:
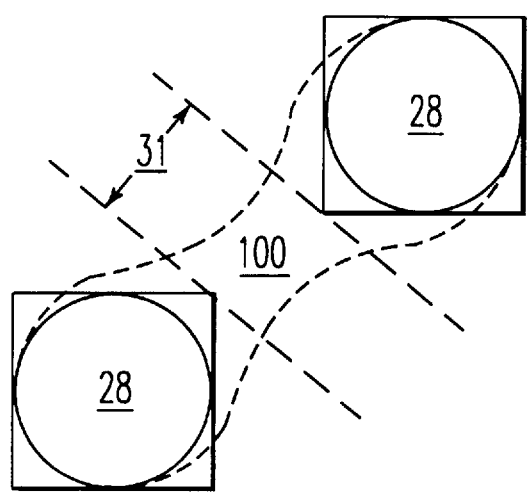
FIG. 15(c) illustrates a planar, exploded top view of a portion of a prior art 6 transistor, CMOS SRAM wherein two contact regions are shown separated by an inadequate resolution distance so as to produce bridging between the contacts.

With reference to FIGS. 13(d)–(f) and the accompanying text, it was pointed out that prior art adjacent contact openings in, for example, a 6T SRAM, must be kept a minimum distance from one another to avoid merging during printing. This result follows, because the prior art integrated circuit structures utilize a method of filling the contact openings, particularly those contact openings corresponding to the pair of inverters, in a single metallization step. Thus, the minimum size of the SRAM device is limited by the required distance of separation between adjacent mask openings, i.e., that minimum distance that will prevent bridging or merging. As a general rule, the minimum distance of separation is equivalent to the feature size of the device (i.e., 0.5 $\mu$m separation for a 0.5 $\mu$m feature size). The invention described herein utilizes multi-level, overlapping interconnect structures. Bridging or merging is not an issue, because the adjacent contact openings are not made at the same point in the process. The contact openings may be directly adjacent to one another. Thus, the minimum distance between adjacent contact openings of distinct interconnect structures and distinct levels is determined solely by the distance needed for electrical isolation.

Figure 82:
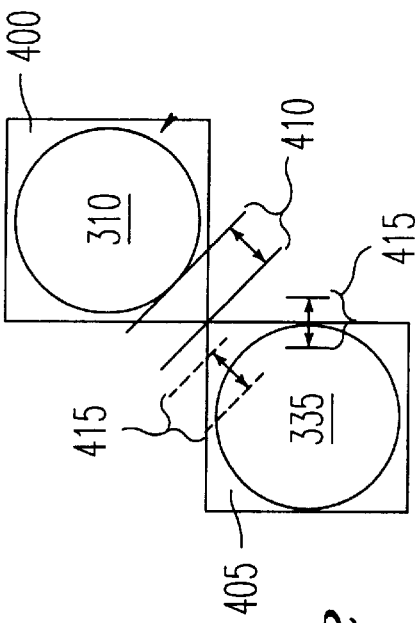
FIG. 82 illustrates a planar exploded top view of a portion of a semiconductor substrate illustrated in FIG. 81.

FIG. 82 illustrates a planar, exploded, top view of a portion of the 6T SRAM presented in FIG. 81. FIG. 82 presents contact 310 to the drain region of N-transistor 300 and contact 335 to the conductive material strap linking the gates of transistors 340 and 345. Contact 310 is coupled to the second level interconnect material layer that overlies the first level interconnect material layer, see FIG. 81. Contact 335 is coupled to the first interconnect material layer, see FIG. 81. FIG. 82 shows the approximately square photo-lithographic mask openings 400 and 405 to expose and make contact openings for contacts 310 and 335, respectively. In 0.5 $\mu$m technology, the approximately square mask opening is appoximately 0.5×0.5 $\mu$m. The contact opening resulting from conventional process techniques will be circular as illustrated in FIG. 82. FIG. 82 also illustrates the edge placement tolerance 415 of the printing mechanism. In general, the edge placement tolerance represents a calculated value of the location of the etch edge in a particular contact opening. A typical edge placement tolerance 415 for 0.5 $\mu$m technology is +0.35 $\mu$m. The greatest distance 410 between the circular contact opening and the square mask is typically approximately 0.207 $\mu$m for each contact opening 310 and 335 for 0.5 $\mu$m technology, for a total minimum distance of 0.414 $\mu$m (0.207+0.207) between the contact openings, which is greater than the edge placement tolerance of 0.35 $\mu$m to keep them isolated.

The invention contemplates that the minimum space required between adjacent contact openings wherein the contact openings are to different interconnect structures on different levels of the circuit (i.e., separated by an insulating layer) is only the distance necessary for electrical isolation, i.e., the electrical voltage standoff. Thus, in FIG. 82, the exposed contact openings for contacts 310 and 335 can be directly adjacent to one another (i.e., no separation). This translates into a typical distance between diagonally adjacent contact openings in different levels of 0.414 μm (0.207+ 0.207) in 0.5 μm technology.

It is to be appreciated by a person of ordinary skill in the art that the invention described above is not limited to any particular feature size device, but is completely scalable. For example, the 9×4 SRAM cell shown in FIG. 81 (i.e., potentially 9 contact opening spacing across and approximately 4 down) will have a cell area of 9 $\mu m^2$ for a 0.5 μm device (9(0.5)×4(0.5)), and an area of 5.76 $\mu m^2$ for a 0.4 μm feature size device. Because the only limitation of the minimum size of the cell described by the invention is the photolithographic mechanisms available, the invention is completely scalable to any feature size system.

While the detailed description in accordance with the invention has been set forth above with regard to the best mode and preferred embodiment or embodiments contemplated by the inventor, it is to be appreciated that the invention is not limited to the above embodiment or embodiments and that various modifications may be made to the above embodiment or embodiments without departing from the broader spirit or scope of the invention as defined in the following claims. The specific embodiment or embodiments are, accordingly, to be regarded in an illustrative rather than a restrictive sense.

What is claimed is:

1. A method of forming a local interconnect between trench isolated devices in an integrated circuit, wherein adjacent trench-isolated devices comprise a first dielectric layer adjacent a semiconductor substrate, a first conductive material layer overlying said dielectric layer and adjacent to an isolation trench, and a second dielectric material in said trench and adjacent said first dielectric material and said conductive material, the method comprising:

selectively etching said second dielectric material to remove a portion of said dielectric material overlying said trench from said trench; and depositing a second conductive layer in said trench to replace said material removed by said etching step and conductively connecting first conductive material layers of adjacent trench isolated devices through a horizontal plane of said first conductive material layers.

2. The method of claim 1, further comprising the step of substantially planarizing said second conductive layer and said first conductive layer to a plane of said first conductive material layer.

3. The method of claim 2, wherein the step of substantially planarizing said second conductive layer and said first conductive layer is accomplished by one of an etch back and a polish process.

4. The method of claim 1, further comprising the step of depositing a third dielectric layer adjacent said first and second conductive layers.

5. The method of claim 1, wherein said first conductive material layers of adjacent trench-isolated devices are the same.

* * * * *